United States Patent
Raz et al.

(10) Patent No.: US 10,854,662 B2
(45) Date of Patent: Dec. 1, 2020

(54) MULTI-BAND IMAGING SYSTEMS

(71) Applicant: UNISPECTRAL LTD., Ramat Gan (IL)

(72) Inventors: Ariel Raz, Kfar Vradim (IL); Viacheslav Krylov, Holon (IL); Eliahu Chaim Ashkenazi, Jerusalem (IL); Peleg Levin, Rishon le-Zion (IL); Efrat Immer, Tel Aviv (IL)

(73) Assignee: UNISPECTRAL LTD., Ramat Gan (IL)

(*) Notice: Subject to any disclaimer, the term of this patent is extended or adjusted under 35 U.S.C. 154(b) by 0 days.

(21) Appl. No.: 16/461,811

(22) PCT Filed: Nov. 18, 2017

(86) PCT No.: PCT/IB2017/057243
§ 371 (c)(1),
(2) Date: May 17, 2019

(87) PCT Pub. No.: WO2018/092101
PCT Pub. Date: May 24, 2018

(65) Prior Publication Data
US 2019/0363116 A1  Nov. 28, 2019

Related U.S. Application Data

(60) Provisional application No. 62/531,515, filed on Jul. 12, 2017, provisional application No. 62/424,470, (Continued)

(51) Int. Cl.
*H01L 27/146* (2006.01)
*H04N 5/225* (2006.01)
(Continued)

(52) U.S. Cl.
CPC .... *H01L 27/1465* (2013.01); *H01L 27/14621* (2013.01); *H04N 5/2254* (2013.01); *H04N 5/332* (2013.01); *H04N 5/369* (2013.01)

(58) Field of Classification Search
USPC .......................................... 348/33
See application file for complete search history.

(56) References Cited

U.S. PATENT DOCUMENTS 8,754,658 B1  6/2014 Miller et al.
8,760,494 B1  6/2014 Twede
(Continued)

FOREIGN PATENT DOCUMENTS

WO  WO-2012178166 A1 * 12/2012 .......... C12Q 1/6806
WO  2014207742 A2  12/2014

*Primary Examiner* — James M Anderson, II
(74) *Attorney, Agent, or Firm* — Kenealy Vaidya LLP

(57) ABSTRACT

Imaging systems and methods for imaging using the same color or monochromatic image sensor, wherein imaging can be switched between at least two imaging modes, for example between a visible imaging mode and an IR imaging mode, without moving any system component from a given position in an optical path between an imaged object and the image sensor. In an example, a system includes an image sensor, a tunable spectral filter and a multi-bandpass filter, the tunable spectral filter and the multi-bandpass filter arranged in a common optical path between an object and the image sensor, and a controller configured and operable to position the tunable spectral filter in a plurality of operation states related to a plurality of imaging modes.

16 Claims, 21 Drawing Sheets

Related U.S. Application Data filed on Nov. 20, 2016, provisional application No. 62/424,472, filed on Nov. 20, 2016.

(51) Int. Cl.
*H04N 5/33* (2006.01)
*H04N 5/369* (2011.01)

(56) References Cited

U.S. PATENT DOCUMENTS

| | | | |
|---|---|---|---|
| 2005/0030657 A1 | 2/2005 | Maier et al. | |
| 2007/0258089 A1* | 11/2007 | Tuschel | G01N 21/05 356/317 |
| 2008/0029714 A1 | 2/2008 | Olsen et al. | |
| 2011/0102565 A1* | 5/2011 | Wang | G01J 3/02 348/61 |
| 2012/0062697 A1 | 3/2012 | Treado et al. | |
| 2012/0194650 A1 | 8/2012 | Izadi et al. | |
| 2014/0240508 A1 | 8/2014 | Gomi | |
| 2015/0256767 A1* | 9/2015 | Schlechter | G01S 7/4816 348/46 |
| 2015/0357357 A1* | 12/2015 | Sargent | H04N 5/378 250/208.1 |
| 2016/0171653 A1* | 6/2016 | Mendlovic | G01J 3/26 348/280 |
| 2016/0270716 A1* | 9/2016 | Guan | A61B 5/0088 |

\* cited by examiner

MULTI-BAND IMAGING SYSTEMS

CROSS REFERENCE TO RELATED APPLICATIONS

This application claims the benefit of U.S. Provisional patent applications 62/424,470 and 62/424,472 filed Nov. 20, 2016 and 62/531,515 filed Jul. 12, 2017, all three of which are incorporated herein by reference in their entirety.

FIELD

Embodiments disclosed herein relate generally to digital cameras and more particularly to digital cameras capable of dual-mode or multi-mode imaging.

BACKGROUND

Color imaging is known and performed in general using digital cameras having pixelated image sensors covered with color filter arrays (CFAs), for example Bayer-type CFAs. Recently, systems and methods for color imaging using sequential imaging have been proposed. Such systems and methods allow capture of colorful images with improved color fidelity and/or with hyperspectral color information.

Tunable spectral filters in the form of an etalon are also known. An etalon comprises two parallel mirrors. The spectral transmission profile is determined by the gap between the mirrors. The tuning of a voltage applied to etalon tunes the gap between the mirrors (which provides a so called "optical cavity") and, in turn, tunes the spectral transmission profile.

Digital cameras combining two-mode imaging capabilities or "modes of operation" (for example color imaging in the visible or "VIS" wavelength range and infrared (IR) imaging in the near IR (NIR) wavelength range) are also known. In general, the VIS range is commonly understood as referring to a spectral range with wavelengths between circa (ca.) 400-700 nanometer (nm), while the NIR range that may be captured by a silicon image sensor is commonly understood as referring to a spectral range with wavelengths between ca. 700-1100 nm. These ranges are approximate and the values cited are by no means limiting. One problem with known cameras is that they normally require mechanisms with moving parts for switching from one mode of operation to another mode of operation.

Co-owned international patent application No. WO2014207742 discloses a dual color/IR camera used for improvement of color imaging.

There is a need for and it would be advantageous to have a multi-mode camera for two or more modes of operation (i.e. for imaging in at least two distinct separate wavelength bands).

SUMMARY

In various embodiments, there are provided digital cameras (also referred to as "digital imaging systems") having at least two modes of operation. Such cameras may be referred to herein as "dual-use", dual-mode", "multi-use" or "multi-mode" cameras. As used herein, the term "imaging" corresponds to acquisition of image data that can be processed, in known ways, into an image. The image data is acquired for example by a pixelated image sensor. The image data may include a total system spectral response (TSSR) to incoming light emitted and/or reflected from an object. For simplicity, the following description refers in details to dual-mode cameras and methods of their use, with the extension to more than two modes becoming clear from the details provided. In one example, the at least two modes of operation may include two separate and distinct modes in a given wavelength range, for example in the VIS range or in the NIR range. In another example, the at least two modes of operation may include two separate modes each in a different wavelength range, for example one mode may be in the VIS (or color) range and the other in the NIR range. The different imaging modes may also be referred to as "VIS imaging", "IR imaging", "color imaging" or "VIS mode", "IR mode", "color mode", etc.

According to some examples, a dual-use camera disclosed herein comprises an image sensor, a tunable spectral filter (e.g. etalon) and a non-tunable (referred to also as "fixed") filter having at least two band-passes or "windows" in its transmission profile, a controller operatively connected to an integrated circuit (IC) driver used to drive the tunable spectral filter. Optionally, the camera may include an image processor device for executing image capture and for processing algorithms. In some exemplary embodiments, the image sensor may be a monochromatic sensor (without a color filter array or "CFA"). In some exemplary embodiments, the image sensor may be a color image sensor having a Bayer type CFA with patterns such as RGGB, RGBW or RWWB or the like. In some exemplary embodiments, the fixed filter may be an "adjusted" IR cutoff filter (IRCF) which transmits (lets passage of light) in the VIS wavelength range and also has a second transmission window that lets in light within the IR wavelength range (i.e. essentially a dual band pass filter). The term "adjusted" refers to the location and width of a "notch", which is defined as the gap between the transmission windows, and which is selected according to the application requirements (for example, to fit a light source wavelength or to work in wavelengths where the ambient light is low due to atmosphere absorption). In some exemplary embodiments, the tunable spectral filter may be a micro-electro-mechanical system (MEMS) filter in the form of an etalon (with at least two transmission states. A dual-use camera may optionally also comprise an active illuminator for illuminating the object or scene at a wavelength X within the sensor's sensitivity range.

When the tunable spectral filter is in one imaging mode, for example a VIS mode, a combined spectral curve, obtained by multiplying the sensor quantum efficiency (Qe) by the actions of the etalon and IRCF, transmits most of the VIS spectra and very little IR intensity, the latter of which may consequently be neglected. Then, various image processing algorithms may be implemented by the image processor.

When the tunable spectral filter is in another imaging mode, for example an IR mode, the combined spectral curve transmits some of the VIS spectrum and as much IR spectrum as possible. As an example, when the tunable spectral filter is an etalon, then depending on the coatings (i.e. coating materials and thicknesses) of the etalon mirrors, there are two alternatives: either (1) the IR mode is 'pure', meaning the VIS transmitted intensity is sufficiently low so that the IR light could be detected easily or (2) the IR mode is 'mixed' with VIS and an additional VIS frame has to be acquired and subtracted from the IR frame. Advantageously, the spectral combination of specific etalon spectral transmittance curves (obtained by configuring a specific etalon mirror gap) with the transmittance curves of the customized IRCF provides an additional degree of freedom (DOF) to obtain the desired transmission curve, as the IRCF removes any irrelevant wavelengths.

In various embodiments, there are provided systems comprising an image sensor, a tunable spectral filter and a non-tunable multi-bandpass filter, the tunable spectral filter and the multi-bandpass filter arranged in a common optical path between an object and the image sensor, and a controller configured and operable to position the tunable spectral filter in a plurality of operation states correlated with a plurality of imaging modes, wherein at least one of the plurality of imaging modes provides respective image data of the object.

In some exemplary embodiments, the tunable spectral filter includes a tunable etalon device. In some embodiments, the tunable etalon device is a micro-electro-mechanical system (MEMS) etalon device. In some embodiments, the MEMS etalon device comprises a front mirror and a back mirror, the front and back mirrors separated in an initial un-actuated etalon state by a gap having a pre-stressed un-actuated gap size, the MEMS etalon device configured to assume at least one actuated state in which the gap has an actuated gap size gap greater than the pre-stressed un-actuated gap size. In some embodiments, the pre-stressed un-actuated gap size is determined by a back stopper structure in physical contact with the front mirror, the back stopper structure formed on a first surface of the back mirror that faces the front mirror.

In some examples of the system, the non-tunable multi-bandpass filter comprises at least a first transmission window and a second transmission window, wherein each transmission window allows passage of light in a certain wavelength range, wherein in a first operation state the tunable filter is positioned to allow passage of light in a first wavelength range which at least partly overlaps with the wavelength range of the first transmission window of the non-tunable multi-bandpass filter such that passage of light outside the first wavelength range is blocked or reduced by the non-tunable multi-bandpass filter, and wherein in a second operation state the tunable filter is positioned to allow passage of light in a second wavelength range different than the first wavelength range.

In some examples, the second wavelength range of the tunable filter at least partly overlaps with the wavelength range of the second transmission window of the non-tunable multi-bandpass filter such that passage of light outside the second wavelength range is blocked or reduced by the non-tunable multi-bandpass filter.

In some examples, the wavelength range of the first transmission window of the non-tunable multi-bandpass filter is narrower than the first wavelength range of the tunable filter such that wavelength range of light passing towards the image sensor is narrower than the first wavelength range, and/or the wavelength range of the second transmission window of the non-tunable multi-bandpass filter is narrower than the second wavelength range of the tunable filter such that wavelength range of transmission of light towards the image sensor is narrower than the second wavelength range.

In some examples the first operation state correlates with a visible (VIS) imaging mode and the second operation state correlates with infrared (IR) imaging mode.

In some examples, the first operation state correlates with a first IR imaging mode corresponding to a first IR wavelength range and the second operation state correlates with a second IR imaging mode corresponding to a second IR wavelength range different than the first wavelength range.

According to some embodiments, there is provided a method of operating an imaging system comprising a tunable spectral filter and a non-tunable multi-bandpass filter, the tunable spectral filter and the multi-bandpass filter arranged in a common optical path between an object and an image sensor, wherein the non-tunable multi-bandpass filter comprises at least a first transmission window and a second transmission window, each transmission window allowing passage of light in a certain wavelength range, the method comprising tuning the tunable spectral filter to a first operation state that correlated with a first imaging mode, wherein in the first operation state the tunable filter is positioned to allow passage of light in a first wavelength range which at least partly overlaps with a wavelength range of the first transmission window of the non-tunable multi-bandpass filter such that passage of light outside the first wavelength range is blocked or reduced by the non-tunable multi-bandpass filter, and tuning the tunable spectral filter to a second operation state that correlates with a second imaging mode; wherein in the second operation state the tunable filter is positioned to allow passage of light in a second wavelength range different than the first wavelength range.

In some examples, the second wavelength range of the tunable filter at least partly overlaps with a wavelength range of the second transmission window of the non-tunable multi-bandpass filter such that passage of light outside the second wavelength range is blocked or reduced by the non-tunable multi-bandpass filter.

In some examples, the wavelength range of the first transmission window of a non-tunable multi-bandpass filter is narrower than the first wavelength range of the tunable filter such that wavelength range of light passing towards the image sensor is narrower than the first wavelength range, and/or the wavelength range of the second transmission window of a non-tunable multi-bandpass filter is narrower than the second wavelength range of the tunable filter such that wavelength range of light passing towards the image sensor is narrower than the second wavelength range.

In some examples, the first operation state correlates with a VIS imaging mode and the second operation state correlates to an IR imaging mode, the method further comprising, while the tunable spectral filter is in the first operation state capturing at least one VIS image, while the tunable spectral filter is in the second operation state activating an IR projector and capturing at least one IR image, and subtracting image data from the at least one VIS image from the image data of the at least one IR image to thereby enhance IR image data.

In some examples, the first operation state correlates to a first IR imaging mode and the second operation state correlates with a shutter mode, the method further comprising correlating the tuning of the tunable spectral filter to the first operation state, with a time window during which overlapping exposure of all pixels or a majority of pixels in the sensor occurs, activating an IR projector during the time window, and correlating the tuning of the tunable spectral filter to the second operation state timed to be outside the time window.

In some examples, the first operation state correlates to a first VIS imaging mode and the second operation state correlates with a shutter mode, the method further comprising correlating the tuning of the tunable spectral filter to the first operation state, with a time window during which overlapping exposure of all pixels or a majority of pixels in the sensor occurs, activating a VIS projector during the time window, and correlating the tuning of the tunable spectral filter to the second operation state, timed to be outside the time window.

In various embodiments, there are provided methods comprising providing a camera comprising an image sensor, a tunable spectral filter, a multi-bandpass filter and a controller, the tunable spectral filter and the multi-bandpass filter arranged in a common optical path between an object and the image sensor, and configuring and operating the controller to position the tunable spectral filter in a plurality of operation states correlated with a plurality of imaging modes, wherein at least one of the plurality of imaging modes provides respective image data of the object.

In some embodiments, the image data is provided in in at least one transmission window.

In some embodiments, the image sensor is a color image sensor and the at least one transmission window is a visible transmission window.

In some embodiments, the image sensor is a monochromatic image sensor and the at least one transmission window is an infrared transmission window.

In some embodiments, the plurality of imaging modes includes a visible imaging mode and an infrared imaging mode.

In some embodiments, the plurality of imaging modes includes two infrared imaging modes.

In some embodiments, the plurality of imaging modes includes an infrared imaging mode and a shutter mode.

In some embodiments, the plurality of operation states includes three states correlated with three imaging modes.

BRIEF DESCRIPTION OF THE DRAWINGS

Non-limiting examples of embodiments disclosed herein are described below with reference to figures attached hereto that are listed following this paragraph. The drawings and descriptions are meant to illuminate and clarify embodiments disclosed herein, and should not be considered limiting in any way. Like elements in different drawings may be indicated by like numerals.

DETAILED DESCRIPTION

Figure 1A:
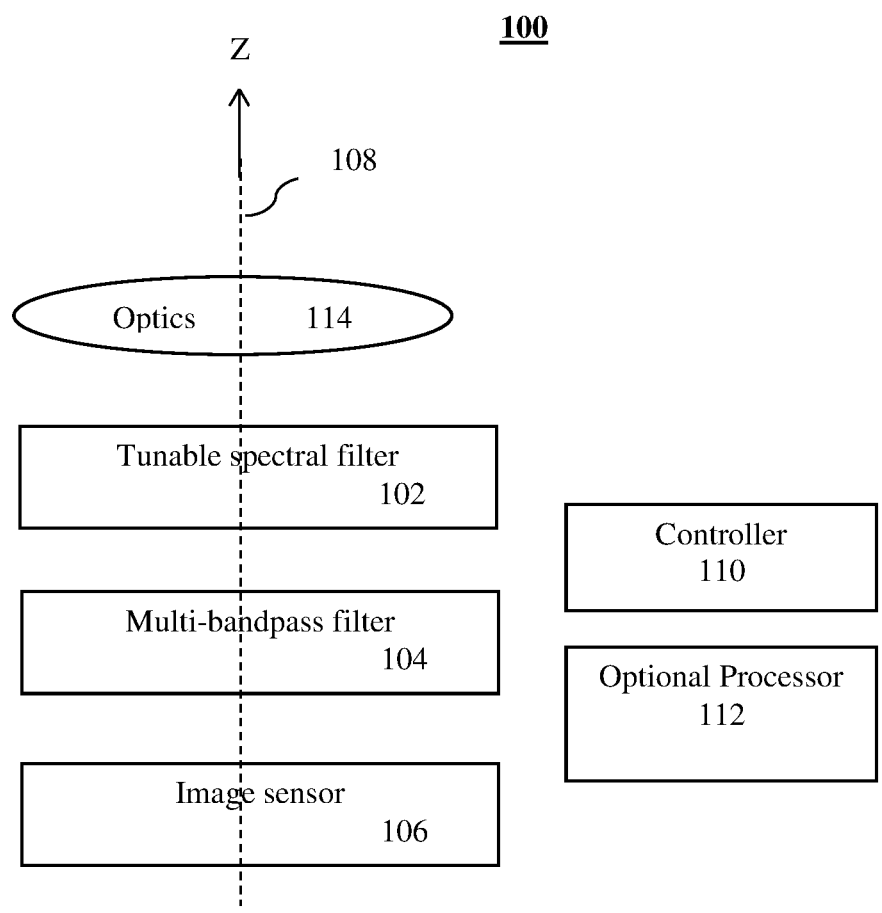
FIG. 1A illustrates schematically an imaging system for dual-mode or multi-mode imaging configured according to some embodiments disclosed herein.

Reference is made to FIG. 1A, which illustrates schematically an imaging system (also referred to as "camera") 100 for dual-use or dual-mode imaging configured according to some embodiments disclosed herein. System 100 includes a tunable spectral filter (for example an etalon) 102, a non-tunable multi-bandpass filter (MBF) 104 and an image sensor (or simply "sensor") 106. A non-tunable multi-bandpass filter blocks all the spectrum for which the sensor is sensitive to (e.g., 400-1100 nm for a CMOS based image sensor) except for the transmission windows (separated by the so called "notches") of the filter. Therefore, it may also be referred to as "multi-window filter", a term used henceforth instead of, or interchangeably with MBF. Etalon 102 and MBF 104 are arranged in a general optical path 108 of light propagation from an object or scene (not shown) towards sensor 106. In some embodiments, sensor 106 may be a monochromatic sensor. In some embodiments, sensor 106 may be a color sensor (with CFA). The CFA can be any type of CFA, for example having a Bayer pattern including (but not limited to) RGGB, RGBW or RWWB per-pixel filter arrangements.

MBF 104 can be in general a multi-window filter, where "multi-window" refers to a filter with a plurality of transmission windows. For example, MBF 104 can be a dual-window filter, a triple-window filter, a four-window filter, etc. Examples for dual-window filters useful in systems and methods disclosed herein include the DB940 dual-bandpass filter for the visible (VIS) and 940 nm IR bands manufactured by Midwest Optical Systems, Inc. 322 Woodwork Lane Palatine, Ill. 60067 USA, and the IRC40 dual-bandpass filter for the VIS and 850 nm IR bands provided by Sunex Inc., USA, 3160 Lionshead Ave, Suite B, Carlsbad, Calif. 92010. DB940 transmits VIS light (e.g. 400-650 nm) and has a narrow transmission window in the IR region (e.g. 920-980 nm) with X=940 nm. Note that the 940 nm and 830 nm transmission windows are given by way of example, and that filters with other transmission windows in the VIS or IR bands are known and commercially available. An example for a triple-band bandpass filter useful in systems and methods disclosed herein includes the Semrock FF01-514/605/730-25 filter, which has transmission windows centered at about 514, 605, and 730 nm.

Figure 1B:
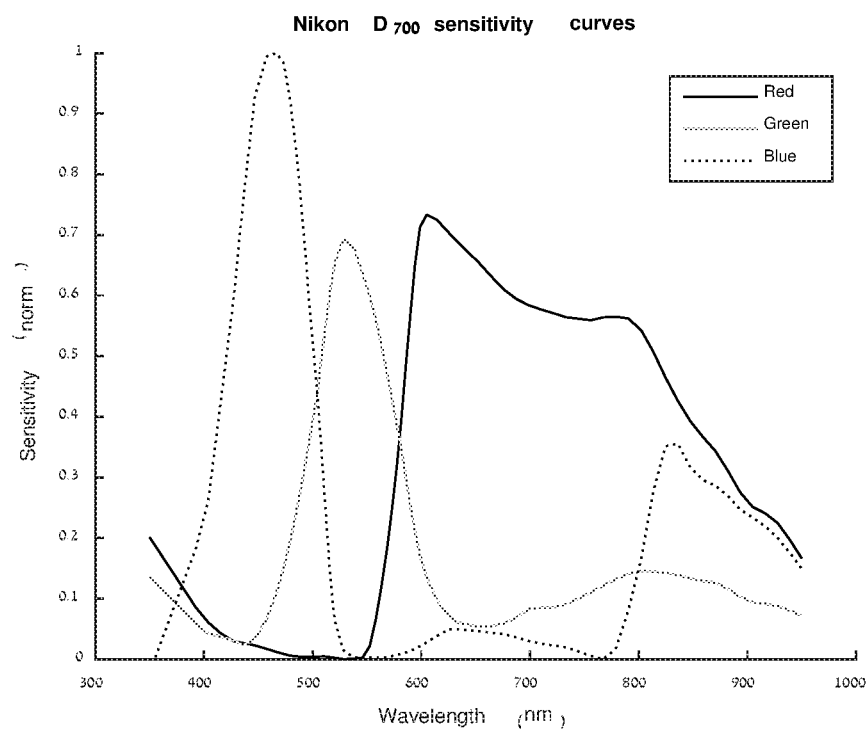
FIG. 1B shows red, green and blue response curves of a color image sensor.
Figure 1C:
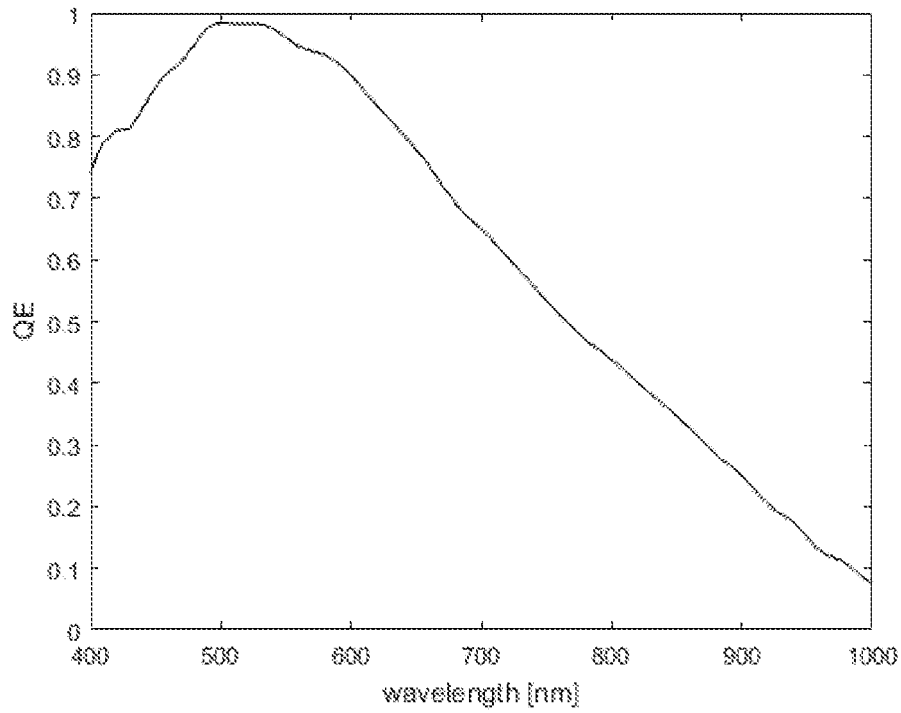
FIG. 1C shows a response curve of a black and white image sensor.

In some exemplary embodiments, the sensor is a color image sensor having a plurality of sensor pixels covered by a color filter array (CFA). FIG. 1B shows red, green and blue response curves of a color image sensor (Nikon D700) used in an exemplary embodiment. The curves express the normalized results of CFA transmission+sensor spectral sensitivity for this image sensor. FIG. 1C shows a normalized response curve of a monochromatic (black and white) image sensor.

Figure 1D:
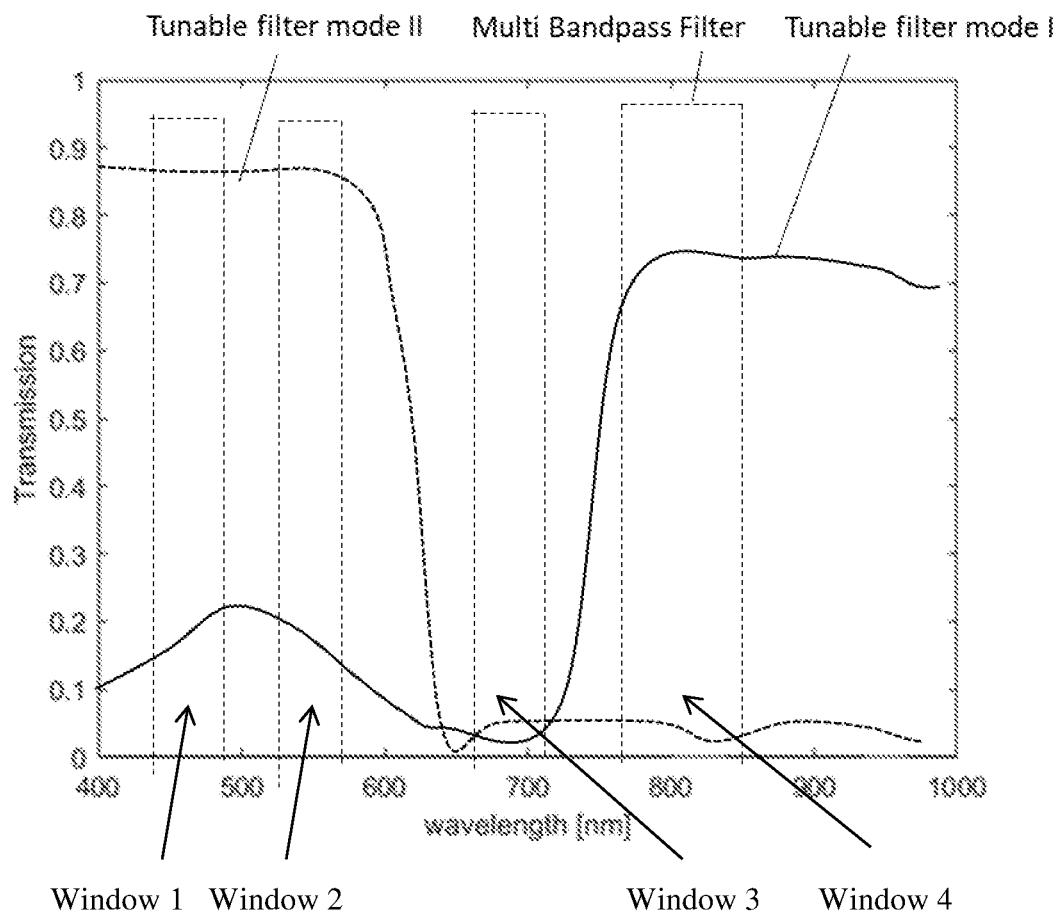
FIG. 1D illustrates schematically transmission curves of a non-tunable four-bandpass (four-window) filter and of a tunable spectral filter positioned in two operation states, according to an example.

FIG. 1D illustrates schematically transmission curves of a non-tunable four-bandpass (four-window) filter and of a tunable spectral filter positioned in two operation states (or "modes"), "mode I" and "mode II". The four windows of the fixed filter in which transmission is high are Window 1, Window 2, Window 3 and Window 4. In mode I of the tunable filter, transmission is low in a lower wavelength range (for example, as shown, between ca. 400 and 720 nm) and is high in a higher wavelength range (for example, as shown, between ca. 780 and 1000 nm). In mode II of the tunable filter, transmission is high in the lower wavelength range (for example, as shown, between ca. 400 and 620 nm) and is low in the higher wavelength range (for example, as shown, between ca. 650 and 1000 nm). The combined action or operation of the two filters enables blocks light in some spectral range or window(s) and allows high transmission of light (e.g. toward an image sensor) in other spectral range or window(s). For example, high transmission is obtained due to the combined action of the tunable filter in mode I and Window 4, and due to the combined action of the tunable filter in mode II and each of Windows 1 and 2. For example, blocking of light is obtained due to the combined action of the tunable filter in either mode I or II and Window 3.

In some examples, system 100 further comprises a controller 110 operatively coupled to etalon 102 and configured and operable to position (drive) the etalon into at least two operation states, for example one for color image acquisition in a color (VIS) imaging mode and one for IR image acquisition in an IR imaging mode. An optics block 114 arranged in optical path 108 between a source object to be imaged (not shown) and the etalon may optionally be part of imaging system 100. Optionally, the imaging system may also include a processor 112 for executing image capture and for processing algorithms, and a structured light (SL) projector (not shown), for example an IR SL projector made by OSELA INC. 1869, 32nd Avenue, Lachine, QC, Canada. The imaging system may further optionally include a light source (such as a LED—not shown) for iris recognition applications.

In an example, etalon 102 is a tunable micro-electro-mechanical system (MEMS) Fabry-Perot (FP) etalon device described in detail with reference to FIG. 2-5 or 7. In other embodiments, other tunable spectral filters may be used for certain purposes. Hereinafter, the MEMS FP etalon may be referred to as "etalon" for simplicity.

Note that the multi-window filter can be positioned at different places along the optical path. For example, it can be positioned between etalon 102 and sensor 106 (as shown), or between optics block 114 and etalon 102.

System 100 may be applied to imaging in at least two separate regions (bands) of the spectrum for which the sensor is sensitive to (e.g., 400-1100 nm for CMOS sensors). This is referred to herein as "multi-band imaging". The at least two spectral bands may be for example within the VIS spectral range, the IR spectral range or in both the VIS and the IR spectral range.

Figure 2A:
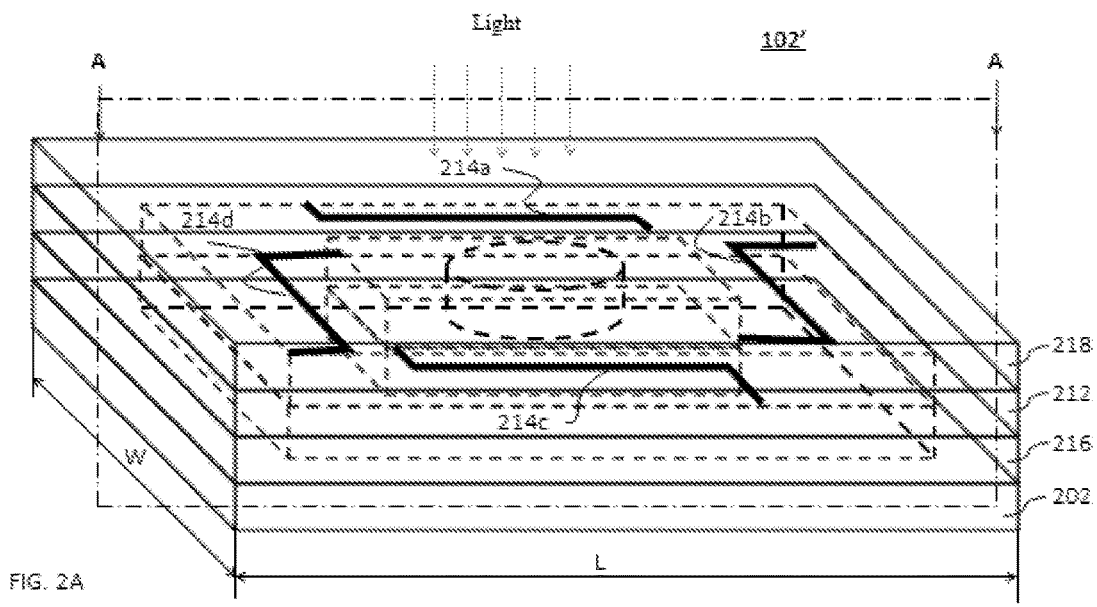
FIG. 2A shows schematically in an isomeric view a first exemplary embodiment of a tunable MEMS etalon device disclosed herein.
Figure 2B:
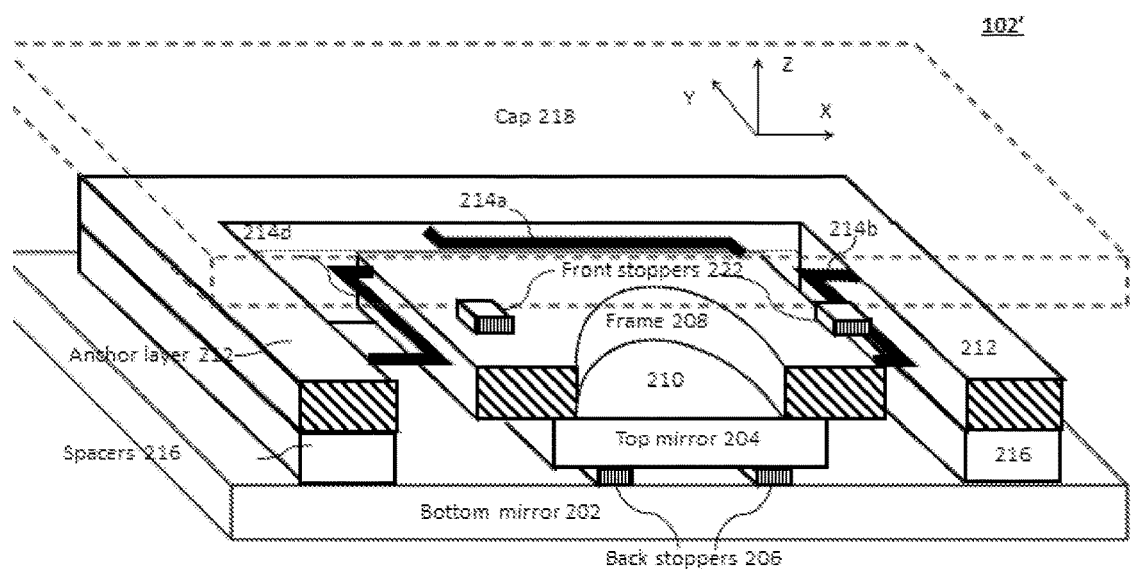
FIG. 2B shows the device of FIG. 2A with a cross section.
Figure 3A:
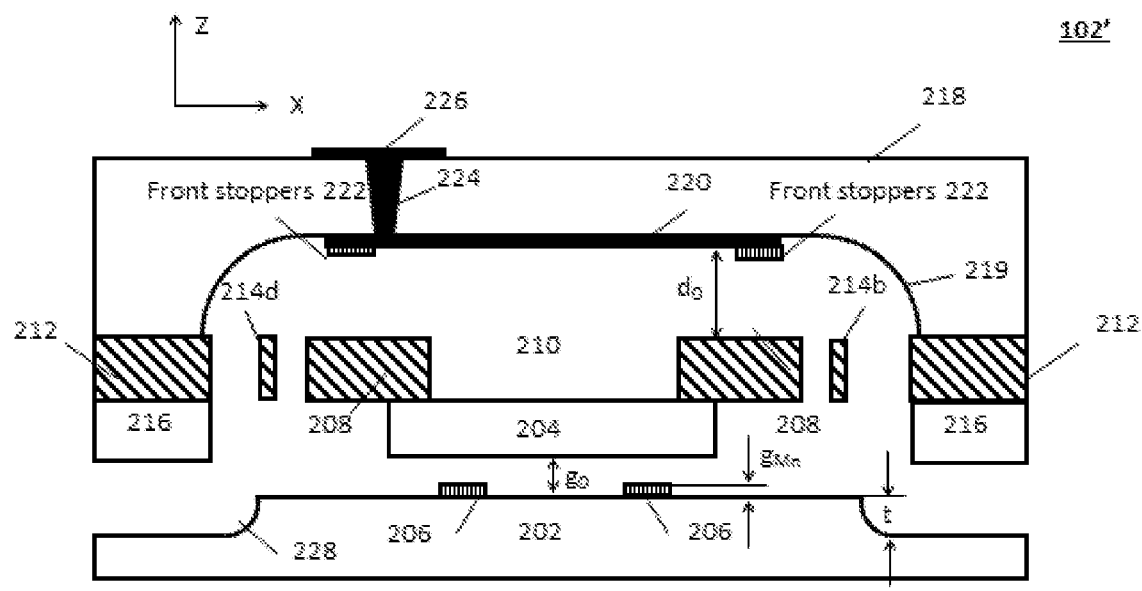
FIG. 3A shows the device of FIG. 2B in an initial as fabricated, non-stressed un-actuated state.
Figure 3B:
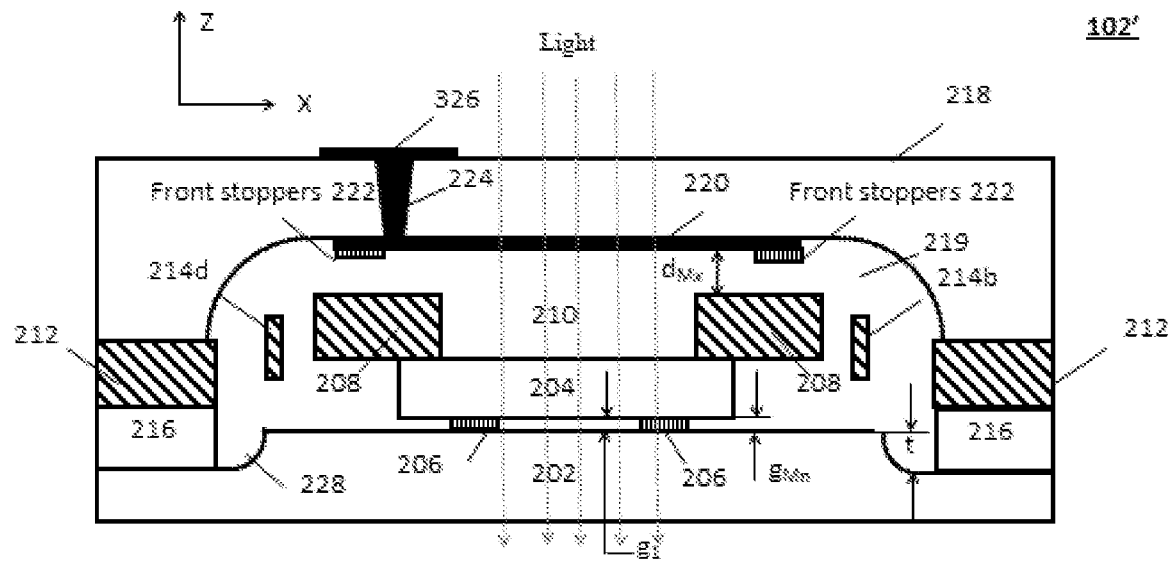
FIG. 3B shows the device of FIG. 2A in an initial pre-stressed un-actuated state.
Figure 3C:
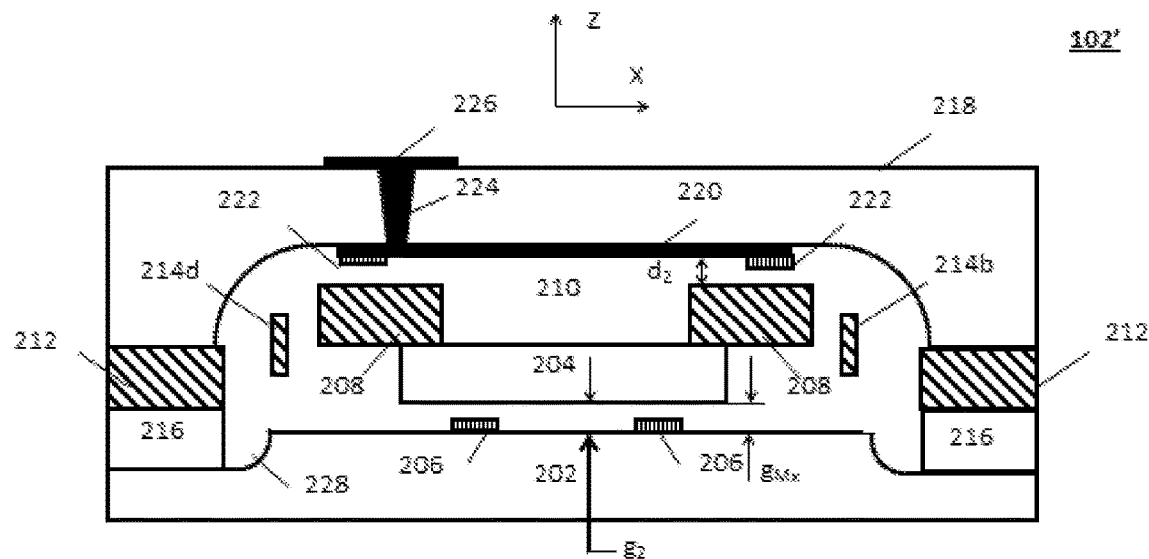
FIG. 3C shows the device of FIG. 2B in an actuated state.

FIG. 2A shows schematically in an isomeric view a first example of a tunable MEMS etalon device disclosed herein and numbered 102'. FIG. 2B shows an isomeric cross section of device 102' along a plane marked A-A. Device 102' is shown in conjunction with a XYZ coordinate system, which also holds for all following drawings. FIGS. 3A, 3B and 3C show cross sections of device 102' in plane A-A in three configurations (states): an as-fabricated (non-stressed) un-actuated state (FIG. 3A), a pre-stressed un-actuated state (FIG. 3B), and an actuated state (FIG. 3C). Device 102' comprises two substantially flat and parallel mirrors/reflective-surfaces, a bottom (or "back") mirror 202 and a top (or "aperture") mirror 204 separated by a "back" gap. As used herein, the terms "front" and "back" reflect the orientation of the device toward light rays. As shown, the front (top) mirror is the first mirror in the path of light rays entering the etalon. In one example, the mirrors are formed in flat glass plates or wafers. The term "glass" as used herein should be interpreted broadly to include any material or combination of materials with suitable transparency to light in a required wavelength range for the etalon and the image sensor to function in a desired way, for example quartz or silica. As used herein, the term "plate", "wafer" or "layer" refers to a substantially two-dimensional structure with a thickness defined by two parallel planes and having a width and a length substantially larger that the thickness. "Layer" may also refer to a much thinner structure (down to nanometers-thick, as opposed to a typical thickness of micrometers for the other layers). In an embodiment, back mirror 202 is formed in a glass wafer that also serves as a substrate of the device. In other embodiments, back mirror 202 may be formed in a "hybrid" plate or hybrid material such that a central section ("aperture") through which the light rays pass is transparent to the wavelength of the light (made e.g. of a glass), while plate sections surrounding the aperture are made of a different material, for example silicon. The hybrid aspect may increase the stiffness and strength of the mirror.

In the as-fabricated state, FIG. 3A, the back gap between the front and back mirrors has a size marked by $g_0$. In the un-actuated state, FIG. 3B, the back gap has a size marked by $g_1$. In an actuated state, FIG. 3C, the back gap has a size marked by $g_2$. The mirrors are movable with respect to each other so that back gap can be tuned between certain minimal ($g_{Mn}$) and maximal ($g_{Mx}$) gap sizes. The movement is in the Z direction in the particular coordinate system shown. Specifically, according to certain examples disclosed herein, back mirror 202 is fixed and front mirror 204 is movable. The gap size is minimal in the pre-stressed un-actuated state, so $g_1=g_{Mn}$. The maximal back gap size $g_{Mx}$ corresponds to a "maximal" actuated state. There are of course many actuated states (and even a continuous range of states) in which the back gap has a value $g_2$ between $g_{Mn}$ and $g_{Mx}$.

Device 102' further comprises a first stopper structure (also referred to as "back stoppers") 206 positioned between mirrors 202 and 204 in a way such as not to block light rays designed to reach an image sensor. Back stoppers 206 may be formed on either mirror. In the initial as-fabricated un-actuated state, FIG. 3A, the two mirrors are located in a close proximity to each other, the minimal gap distance $g_{Mn}$ being defined by back stoppers 206 which function as displacement limiters. An additional function of stoppers 206 is to prevent undesirable displacement of the front mirror due to external shock and vibration. Back stoppers 206 are designed to prevent contact between the mirrors and ensure that $g_{Mn}$ is never zero. They may be located within an optical aperture area if their size is small and they do not obscure significantly the optical signal. The location of the back stoppers within an optical aperture area may be optimized in such a way that the displacement of movable front mirror 204 is minimal. In some examples, back stoppers 206 are made of a metal such as patterned Cr—Au layer, Ti—Au layer or Ti—Pt layer. The degrees of reflectivity/transparency of the top and back mirrors are selected in accordance with the desired spectral transmission properties of the etalon. According to some examples, each mirror is semi-reflective to some degree.

Device 102' further comprises a mounting frame structure (or simply "frame") 208 with an opening ("aperture") 210. Frame 208 is made for example of single crystal silicon and is fixedly attached (e.g. by bonding) to front mirror 204. That is, mirror 204 is "mounted" on frame 208 and therefore moves together with frame 208. Opening 210 allows light rays to enter the etalon through the front mirror. Therefore, the front mirror is also referred to sometimes as "aperture mirror".

In some examples, back mirror 202 and optionally front mirror 204 include a Titanium Oxide ($TiO_2$) layer deposited on a glass layer/substrate. In certain examples, a device disclosed herein may comprise one or more electrodes (not shown) formed on back mirror 202 on the surface facing frame 208, to enable actuation of the frame structure (and thereby cause movement of the front mirror) toward the back mirror. Alternative actuation mechanisms may be applied, e.g. piezoelectric actuation, Kelvin force, etc. The movement of the front mirror towards or away from the back mirror tunes the spectral transmission band profile of the etalon.

Device 102' further comprises an anchor structure (or simply "anchor") 212, made for example of single crystal silicon. Anchor 212 and frame 208 are attached to each other by a flexure/suspension structure. The suspension structure may be for example a region of anchor structure 212 patterned in the form of a bending or torsional spring, a combination of such springs, or as a thin doughnut-shaped membrane adapted to carry the front mirror. In device 102', the suspension structure includes a plurality of suspension springs/flexures. According to some examples, in device 102', the plurality of suspension springs/flexures includes four springs, 214a, 214b, 214C and 214d, made of single crystal silicon. In other examples springs/flexures are made from glass. Together, frame 208, anchor 212 and springs 214 form a "functional mechanical layer" 400, shown in a top view in FIG. 4.

FIGS. 3A-3C show that a surface of front mirror 204 facing incoming light is attached to frame 208. It also shows that a flexure structure, comprising four springs 214a, 214b, 214C and 214d (see FIG. 4), is attached to anchor 212 and to frame structure 208 but not attached to the front mirror.

Frame 208 is spaced apart from back mirror 202 by a spacer structure (or simply "spacers") 216. According to some examples, spacers 216 can be formed of a glass material. Spacers 216 are used to separate the frame and springs from the plate in which mirror 202 is formed. While in principle Si anchors 212 could be attached to the bottom plate directly without spacers 216, this requires very large deformation of the springs. For the adopted geometry, this deformation is beyond the strength limit of the spring material, which requires the presence of spacer layer 216. For technological reasons, in some examples, both movable front mirror 204 and spacers 216 are fabricated from the same glass plate (wafer). This simplifies fabrication, since the glass and Si wafers are bonded at wafer level. For this reason, device 102' is referred to herein as a glass-Si-glass (GSG) device.

Device 102' further comprises a cap plate (or simply "cap") 218 having electrodes 220 formed on or attached thereto (see FIGS. 3A to 3C). Electrodes 220 can be positioned for example at a bottom side (facing the mirrors) of cap 218. Electrodes 220 are in permanent electrical contact through one or more through-glass vias 224 with one or more bonding pads 226 positioned on the opposite (top) side of cap 218. Electrodes 220 are used for actuation of frame 208 (thereby causing movement of front mirror 204). The cap comprises a first recess (cavity) 219 to provide a "front" (also referred to as "electrostatic") gap d between frame 208 and electrodes 220. In the as-fabricated configuration (before the bonding of the device to the back mirror), FIG. 3A, gap d has a size $d_0$. After bonding, in the pre-stressed un-actuated state shown in FIG. 3B, gap d has a maximal size $d_{Mx}$. In any actuated state (as in FIG. 3C), gap d has a size $d_2$. Device 102' further comprises front stoppers 222 that separate between frame 208 and cap 218. In some examples, front stoppers 222 isolate electrically (prevent electrical shorts between) frame 208 from cap electrodes 220. In some examples, front stoppers 222 define a maximal gap between front mirror 204 and back mirror 202.

In an example, the cap is made of a glass material. In other examples, cap 218 may be made of a "hybrid" plate or hybrid material such that a central section ("aperture") through which the light rays pass is transparent to the wavelength of the light (made e.g. of a glass), while plate sections surrounding the aperture are made of a different material, for example silicon. The hybrid aspect may increase the stiffness and strength of the cap.

In certain examples, particularly where imaging applications are concerned, the length L and width W (FIG. 2A) of mirrors 202 and 204 should on one hand be large enough (e.g. on the order of several hundred micrometers (μm) to several millimeters (mm)) to allow light passage to a relatively wide multi-pixel image sensor. On the other hand, the minimal gap $g_{Mn}$ should be small enough (e.g. a few tens of nanometers (nm)) to allow desired spectral transmission properties of the etalon. This results in a large aspect ratio of the optical cavity between the mirrors (e.g. between the lateral dimensions W and L and the minimal gap distance $g_{Mn}$), which in turn requires that accurate angular alignment is maintained between the mirrors to reduce or prevent spatial distortion of the chromatic spatial transmission band of the etalon along the width/lateral spatial directions thereof. In some examples, $g_{Mn}$ may have a value of down to 20 nanometers (nm), while $g_{Mx}$ may have a value of up to 2 μm. According to one example, the value of $g_{Mx}$ may be between 300 to 400 nm. Specific values depend on the required optical wavelength and are dictated by a specific application. Thus, $g_{Mx}$ may be greater than $g_{Mn}$ by one to two orders of magnitude. In certain examples, L and W may each be about 2 millimeter (mm) and springs 214 may be each about 50 μm thick, about 30 μm wide and about 1.4 mm long. In certain examples, the thicknesses of the glass layers of the cap 218, the back mirror 202 and the front mirror 204 may be about 200 μm. In some examples, L=W.

It should be understood that all dimensions are given by means of example only and should not be considered as limiting in any way.

FIGS. 3A-3C provide additional information on the structure of device 102' as well as on the function of some of its elements. As mentioned, FIG. 3A shows device 102' in an initial, as-fabricated and un-actuated, non-stressed state. As-fabricated, front mirror 204 does not touch back stoppers 206. FIG. 3B shows the device of FIG. 3A in an initial pre-stressed un-actuated state, with front mirror 204 physically touching back stoppers 206. The physical contact is induced by stress applied on the frame through the springs when spacer layer 216 is forced into contact with the glass wafer substrate (which includes back mirror 202) for eutectic bonding of spacers 216 to the glass plate of back mirror 202. Thus, the configuration shown in FIG. 3B (as well as in FIG. 6B) is said to be "pre-stressed". FIG. 3C shows the device in an actuated state, with front mirror 204 in an intermediate position between back stoppers 206 and front stoppers 222, moved away from back mirror 202.

Back mirror 202 includes a second recess 228 with a depth t designed to provide pre-stress of the springs after assembly/bonding. According to some examples, recess depth t is chosen on one hand such that the contact force arising due to the deformation of the springs and the attachment of front movable mirror 204 to back stoppers 206 is high enough to preserve the contact in the case of shocks and vibrations during the normal handling of the device. On the other hand, in some examples, the combined value of recess depth t plus the maximal required travel distance (maximal back gap size) $g_{Mx}$ is smaller than one third of an as-fabricated ("electrostatic") gap size $d_0$ of a gap between electrodes 220 and frame 208 (FIG. 3A), to provide stable controllable electrostatic operation of the frame by the electrodes located on the cap. In certain examples, the as-fabricated electrostatic gap $d_0$ may have a value of about 3-4 μm and t may have a value of about 0.5-1 μm. The requirement for stable operation is $t+g_{Mx}<d_0/3$, since the stable travel distance of a capacitive actuator is ⅓ of the as-fabricated electrostatic gap, i.e. is $d_0/3$.

Note that in certain examples, an un-actuated state may include a configuration in which movable mirror 204 is suspended and does not touch either back stoppers 206 or front stoppers 222.

In the actuated state, shown in FIG. 3C, the mounting ring and the front mirror are displaced away from the back mirror. This is achieved by applying a voltage V between the one or more regions/electrodes 220 of the actuation substrate serving as an actuating electrode and the one or more regions frame 208.

According to some examples, device 102' is fully transparent. It includes a transparent back mirror (202), a transparent front mirror (204) and a transparent cap (218) as well as transparent functional mechanical layer 400. One advantage of the full transparency is that the device can be observed optically from two sides. Another advantage is that this architecture may be useful for many other optical devices incorporating movable mechanical/optical elements, such as mirrors, diffractive gratings or lenses. In some examples, device 200 is configured as a full glass structure, where the functional mechanical layer includes a glass substrate that is pattered to accommodate/define the suspension structure carrying the top mirror, the suspension structure including a plurality of glass springs/flexures.

Figure 4:
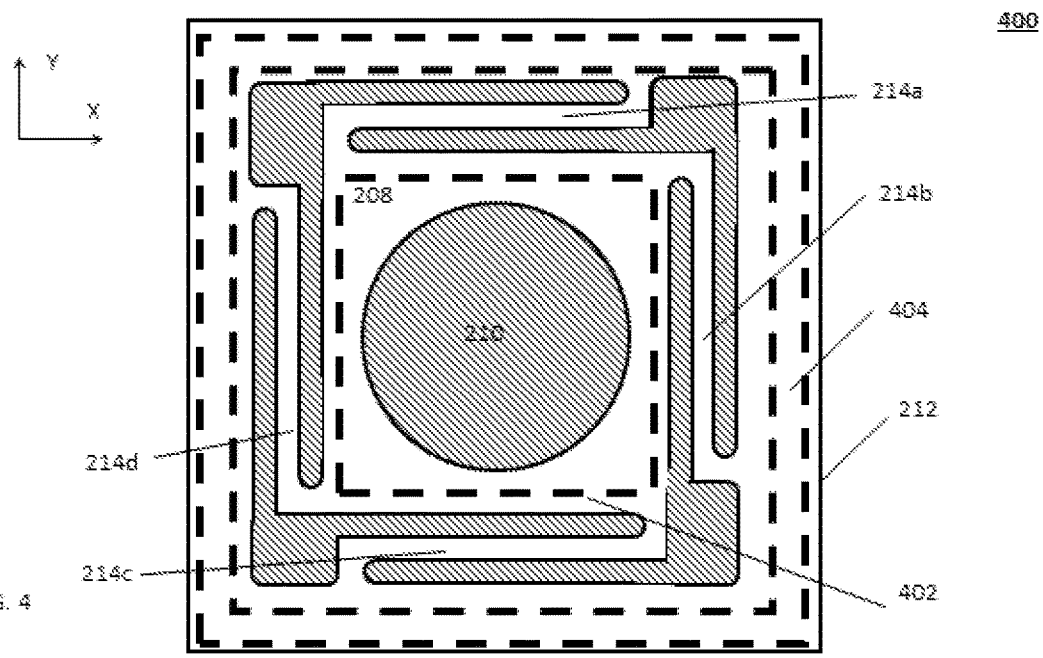
FIG. 4 shows schematically a top view of the functional mechanical layer in the device of FIG. 2A or FIG. 2B.

FIG. 4 shows schematically a top view of functional mechanical layer 400. The figure also shows an external contour 402 of front mirror 204, aperture 210, anchor structure 212, springs 214*a-d* and a contour 404 of the spacer structure.

Figure 5:
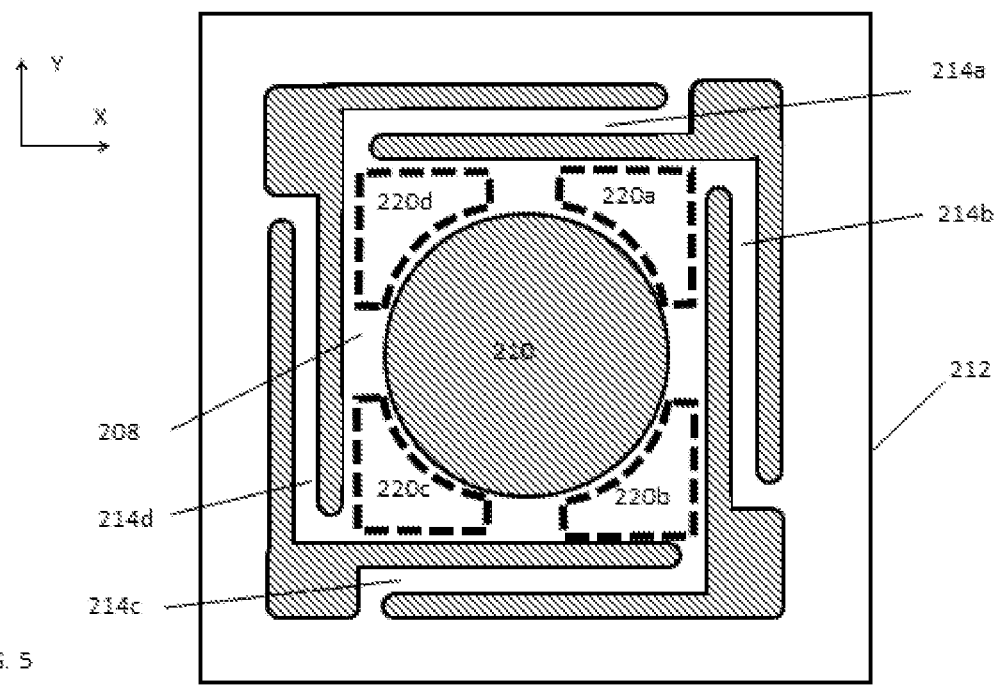
FIG. 5 shows a cap with multiple electrodes.

FIG. 5 shows schematically a top view of cap 218 with a plurality of electrodes 220, marked here 220*a*, 220*b*, 220*c* and 220*d*. The number and shape of electrodes 220 shown are shown by way of example only and should not be construed as limiting. According to some examples, three electrodes 220 are required to control both the displacement of the frame in the Z direction and the tilting of the frame about X and Y axes. Multiple electrode regions, e.g. as shown in FIG. 5, may be fabricated on cap 218 such that front mirror 204 can be actuated with an up-down degree of freedom (DOF) along the Z direction and can also be tilted (e.g. with respect to two axes X and Y) to provide additional angular DOF(s). This allows adjustment of angular alignment between front mirror 204 and back mirror 202.

Following is an example of a method of use of device 102', according to some examples of the presently disclosed subject matter. Device 102' is actuated to bring the etalon from the initial pre-stressed un-actuated state (FIG. 3B) to an actuated state (e.g. as in FIG. 3C). The actuation moves frame 208 and front mirror 204 away from back mirror 202, increasing the back gap between the mirrors. An advantageously stable control of the back gap is enabled by the innovative design in which the initial maximal as-fabricated (and non-stressed) front gap size $d_0$ (FIG. 3A) is about three times larger than the combined recess depth t and the maximal required travel (back gap) size $g_{Mx}$. This is because the stable range of the parallel capacitor electrostatic actuator is one third of the initial distance between the electrodes.

According to one example, device 102' may be used as a pre-configured filter for specific applications. For example, the device may be pre-configured to assume two different states, where the gap between the mirrors in each one of the two states (as set by the stoppers) is according to the desired wavelength. For example, one state provides a filter that allows a first wavelength range to pass through the etalon, while the other state allows a second wavelength range to pass through the etalon. The design for such a "binary mode" filter is related to a simple and accurate displacement of the mirrors between the two states, and allows simplified manufacturing.

According to one example, one state is the initial un-actuated etalon state $g_1$ (where the gap size between the mirrors is defined by stoppers 206) selected to allow a first wavelength range to pass through the etalon and the other state is one actuated state in which the gap has an actuated gap size $g_2$, greater than the pre-stressed un-actuated gap size and resulting in electrical gap $d_2$ which is equal to the height of front stoppers 222, selected to allow a second wavelength range to pass through the etalon. In the second state frame 208 is in contact with front stoppers 212.

Figure 6A:
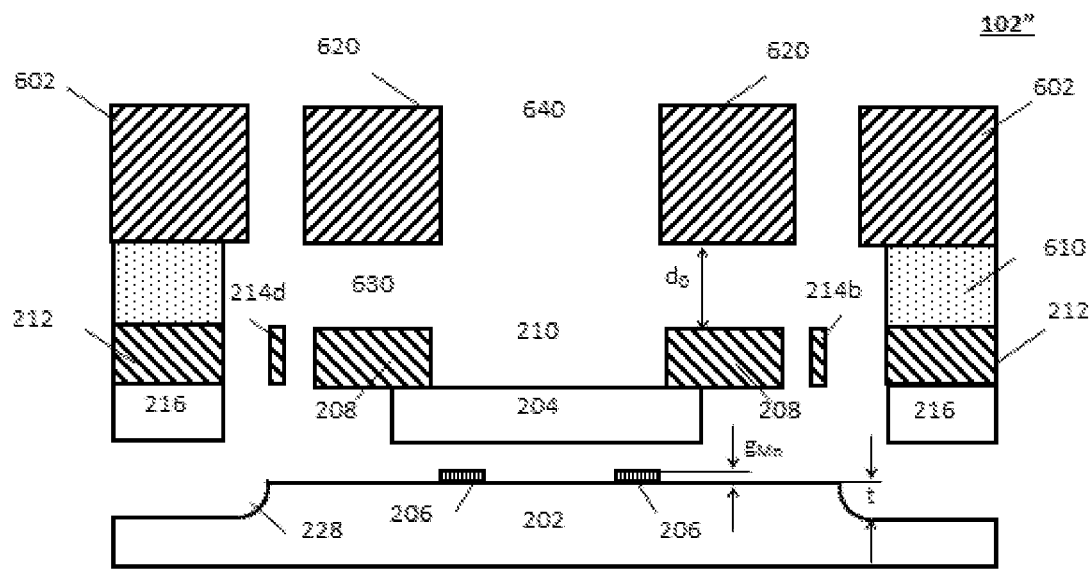
FIG. 6A shows schematically a second exemplary embodiment of a tunable MEMS etalon device disclosed herein, in a cross-sectional view and in an initial as fabricated, non-stressed un-actuated state.
Figure 6B:
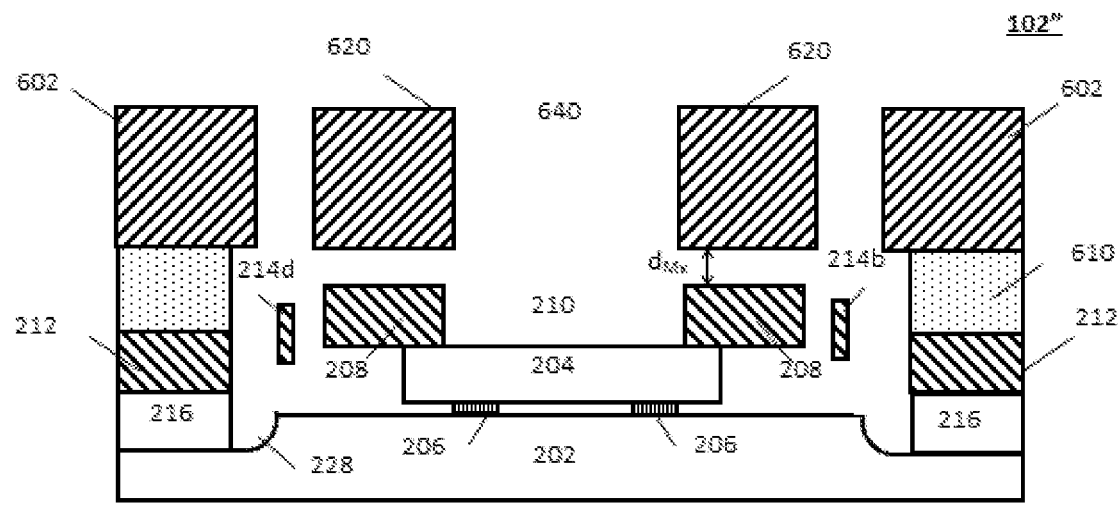
FIG. 6B shows the device of FIG. 6A in an initial pre-stressed un-actuated state.
Figure 6C:
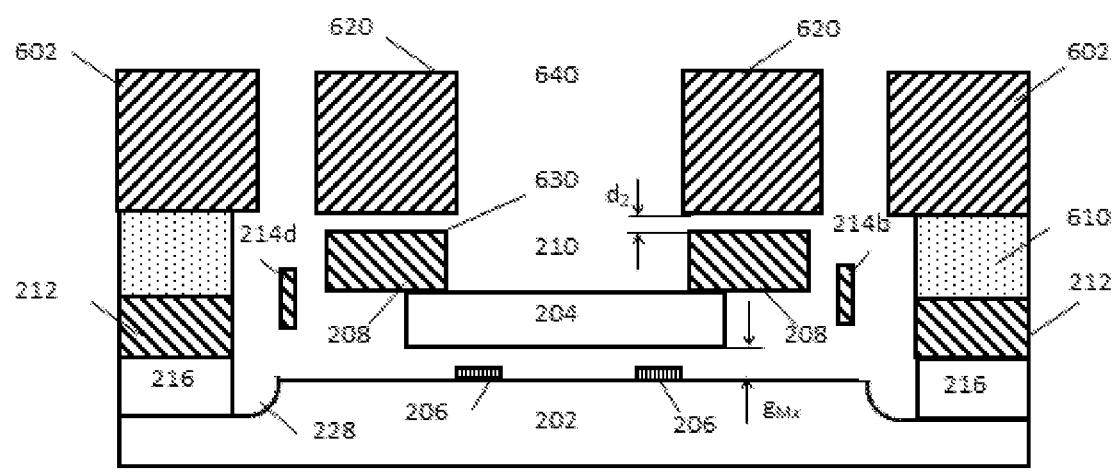
FIG. 6C shows the device of FIG. 6B in an actuated state.

FIGS. 6A-6C show schematically in cross-sectional views a second example of a tunable MEMS etalon device disclosed herein and numbered 102". FIG. 6A shows device 102" in an as-fabricated (non-stressed) configuration, before the bonding of spacers 116 to the back mirror 102. FIG. 5B shows device 102" in an initial pre-stressed un-actuated state, while FIG. 5C shows device 102" in an actuated state. Device 102" uses a SOT wafer and SOT fabrication technology and is therefore referred to herein a "SOT device", in contrast with GSG device 102'. Device 102" has a similar structure to that of device 102' and includes many of its elements (which are therefore numbered the same). Since both SOT wafers and technology are known, the following uses SOT terminology known in the art.

In FIG. 6A, front mirror 104 is not in physical contact with the back stoppers 206 on back mirror 102, while in FIG. 6B, the pre-stress brings front mirror 204 and back stoppers 206 into physical contact. In FIG. 6C, front mirror 204 has moved away from back mirror 202 and is in an intermediate position between the back stoppers 206 and electrodes 620, which in the SOT device are made of a handle layer 602 of the SOT wafer. The SOT wafer is used such that the handle layer serves as a substrate as well as for fabrication of electrodes 620. Frame 208 includes regions that serve as the opposite electrode. An anchor structure (layer) 212 in the device Si layer of the SOT wafer is connected to frame 208 through springs 214a-d. Anchor 212 is attached to handle layer 602 through a BOX layer 610. A gap between the Si device and handle layers is indicated by 630. Gap 630 is created by etching the BOX layer 610 under the frame and under the springs. An opening 640 is formed in handle layer 602, exposing front mirror 204 and back mirror 202 to light rays in the –Z direction.

In the as-fabricated state, before the bonding of spacers 216 to the glass plate comprising back mirror 202, gap 630 between the frame and the handle layer has a size $d_0$ and is equal to the thickness of the BOX layer, FIG. 6A. After the bonding, gap 630 has a size $d_{Mx}$ equal to the thickness of BOX layer 610 minus the depth t of recess 228 and minus the height of back stoppers 206. Thus, $d_{Mx}$ is smaller than $d_0$ due to the pre-stress, since when front mirror 204 contacts back stoppers 206 the springs are deformed and the size of released gap 630 decreases. Upon actuation, FIG. 6C, frame 208 pulls front mirror 204 away from back mirror 202, further decreasing the size of gap 630 to $d_2$ and increasing the size of the back gap (at most, up to a maximal size $g_{Mx}$).

Figure 7:
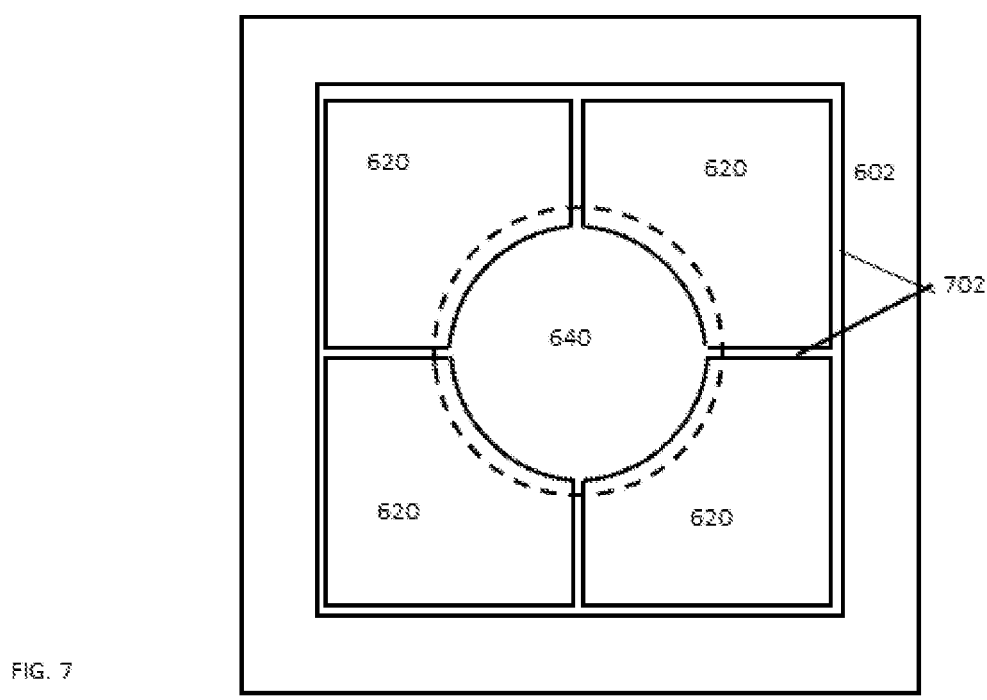
FIG. 7 shows a bottom view of the handle layer of the SOI wafer in the device of FIG. 6.

FIG. 7 shows a schematic illustration of a bottom view of the handle layer of the SOT wafer. The figure shows an insulating trench 702 between electrodes 620. In certain examples, one or more regions/electrodes of the handle layer 620 may include two or more regions that are substantially electrically insulated from one another. Accordingly, application of different electric potentials between these two or more regions of handle layer 620 and of frame 208 allows adjusting parallelism between the front mirror and the back mirror. For instance, the two or more regions of the handle layer may include at least three regions, arranged such that parallelism between the front and back mirrors can be adjusted two-dimensionally with respect to two axes.

Tunable etalons disclosed herein in devices 100, 102' and 102" may be used for imaging applications. For example, these devices may be designed and used as a wide dynamic filter tunable over a wide spectral band (e.g. extending from infra-red [IR] or near-IR (NIR) wavelengths in the long wavelength side of the spectrum, through the visible (VIS) range down to the violet and/or ultra-violet (UV) wavelengths at the short wavelength side of the spectrum. In addition and/or alternatively, such devices may be designed to have a wide spectral transmission profile (e.g. a full width half maximum (FWHM) of the spectral transmission profile of approximately 60-120 nm, which is suitable for image grabbing/imaging applications) and to also have a relatively large free spectral range (FSR) between successive peaks on the order of, or larger than 30 nm, thereby providing good color separation.

Devices disclosed herein use for example electrostatic actuation to tune the spectral transmission and other properties of the etalon. The term "electrostatic" actuation is used to refer to close gap actuation provided by a parallel plate electrostatic force between one or more electrodes on each of two layers of a device. For example, in device 102', the electrostatic actuation is performed by applying voltage between one or more regions of frame 208 and one or more electrodes 220 formed/deposited on the bottom surface of cap 218. In device 102", the electrostatic actuation is performed by applying voltage between one or more regions of frame 208 and one or more regions of handle layer 602. This provides tunability of the displacement between the mirrors and therefore of the etalon.

One of the central challenges of the electrostatic actuation is the presence of so-called pull-in instability, which limits the stable displacement of the approaching electrode (e.g. mounting frame 208 in both device 102' and device 102") towards the static electrode (e.g. electrodes 220 or 620) to one-third of the initial gap between them. Thus, in electrostatic actuation configurations disclosed herein, the initial gap between the handle layer and the mounting frame or between the electrodes 220 and the mounting frame is significantly larger (at least 4-5 times) than the required maximal optical gap $g_{Mx}$. Therefore, the gap between the front and back mirrors in the range $g_{Mn}$ to $g_{Mx}$ is in a stable range of the actuator and the pull-in instability is eliminated.

As mentioned above, electrostatic actuation is merely one example of an actuation mechanism used for tuning the gap between the front and back mirrors, which is applicable in MEMS etalon devices as disclosed herein and should not be construed as limiting. The presently disclosed subject matter further contemplates other types of actuation mechanisms such as piezo-electric actuation and Kelvin force actuation.

Specifically, in some examples the etalon system includes a piezoelectric actuation structure that is attached to the frame structure such that application of electric voltage enables actuation of the frame structure (and thereby causes movement of the front mirror) away from the back mirror. In some examples, upon actuation, frame 208 pulls front mirror 204 away from back mirror 202, thereby increasing the size of gap between them and thus increasing the size of the back gap. By placing several piezoelectric actuation structures on different parts/flexures/springs of the frame, the parallelism between the aperture mirror and the back mirror of the etalon can be controlled.

Etalon Example 1

In a first exemplary embodiment, the etalon includes a two layer coating, with a 120 nm $MgF_2$ layer next to the glass of each mirror 202 and 204 and a 80 nm TiO$_2$ on top of the MgF2 layer. This provides a VIS imaging mode at a gap of 240 nm between the mirrors and an IR imaging mode at a gap of 30 nm between the mirrors.

Figure 8A:
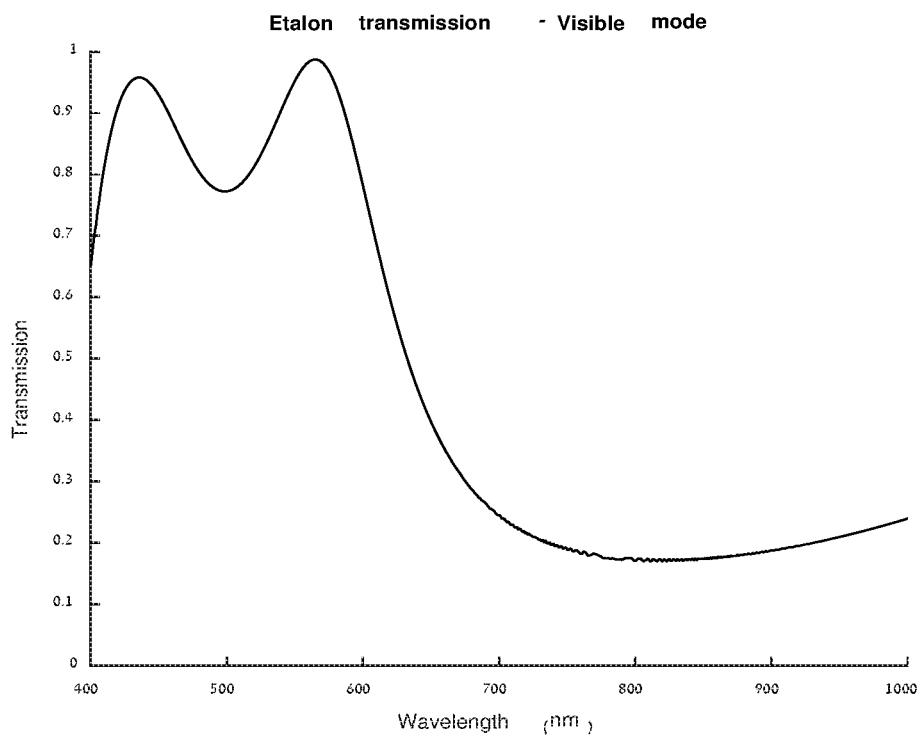
FIG. 8A shows the transmission curve of the etalon in the visible imaging mode, according to one embodiment.
Figure 8B:
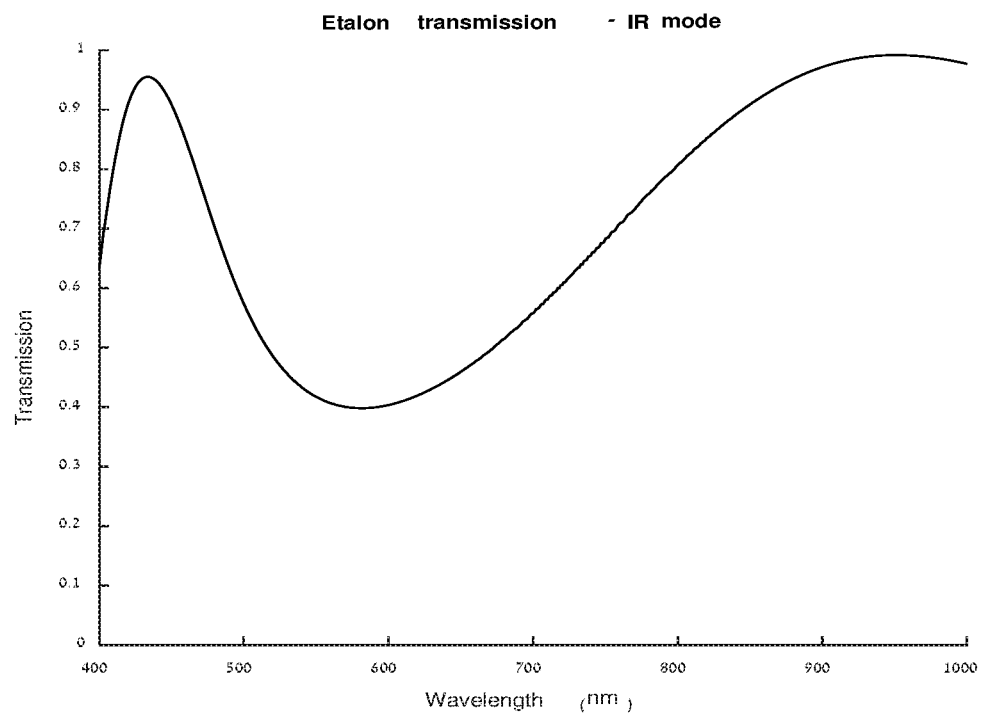
FIG. 8B shows the transmission curve of the etalon in the IR imaging mode, according to the embodiment.

FIG. 8A shows the transmission curve of the etalon in the visible imaging mode. The normalized transmission values range between 0 (no transmission) and 1 (full transmission). FIG. 8B shows the transmission curve of the etalon in the IR imaging mode. In the VIS imaging mode, the etalon transmits mainly in the wavelength range of 400-700 nm, In the IR imaging mode, the etalon transmits in a narrow VIS range between ca. 400-500 nm, as well as in an IR range of ca. 750-1000 nm. In both cases the transmission curve is continuous, with a dip in the spectral range between VIS and NIR that still shows significant energy (ca. 20-30% of a maximal amplitude).

Note that the example above, in which the IR imaging mode is achieved with an un-actuated etalon state (with gap $g_{Mn}$) and the VIS imaging mode is achieved with an actuated etalon state, is by no means limiting. To clarify, by using different mirror coatings, one can achieve the VIS mode with an un-actuated etalon state and the IR mode with an actuated etalon state, see Example 2 below.

Figure 9A:
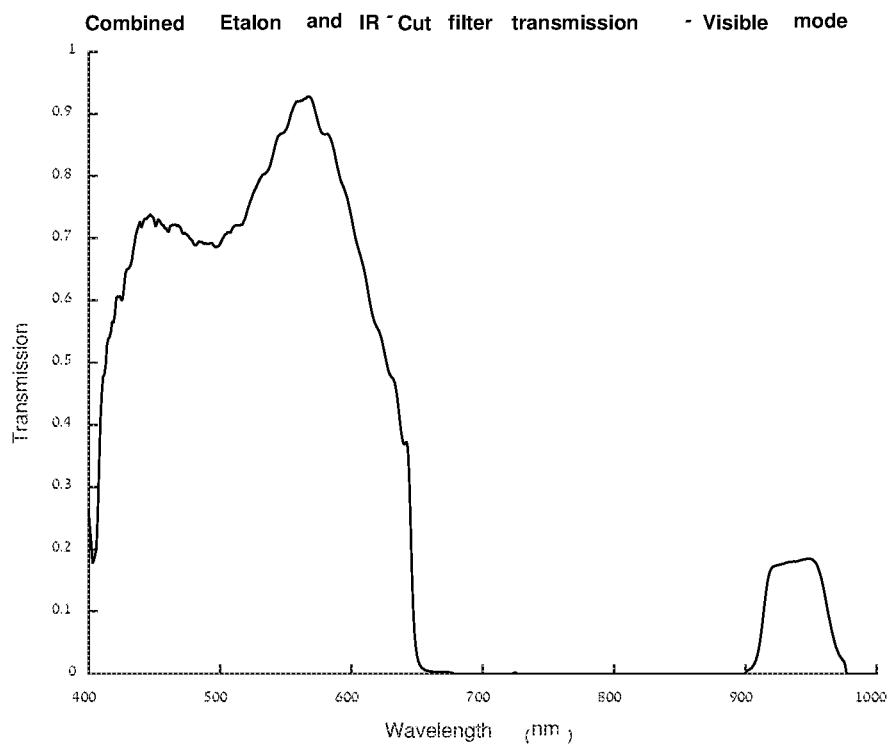
FIG. 9A shows a combined transmission curve of the etalon and IRCF in the visible imaging mode, according to the embodiment of FIG. 8A.
Figure 9B:
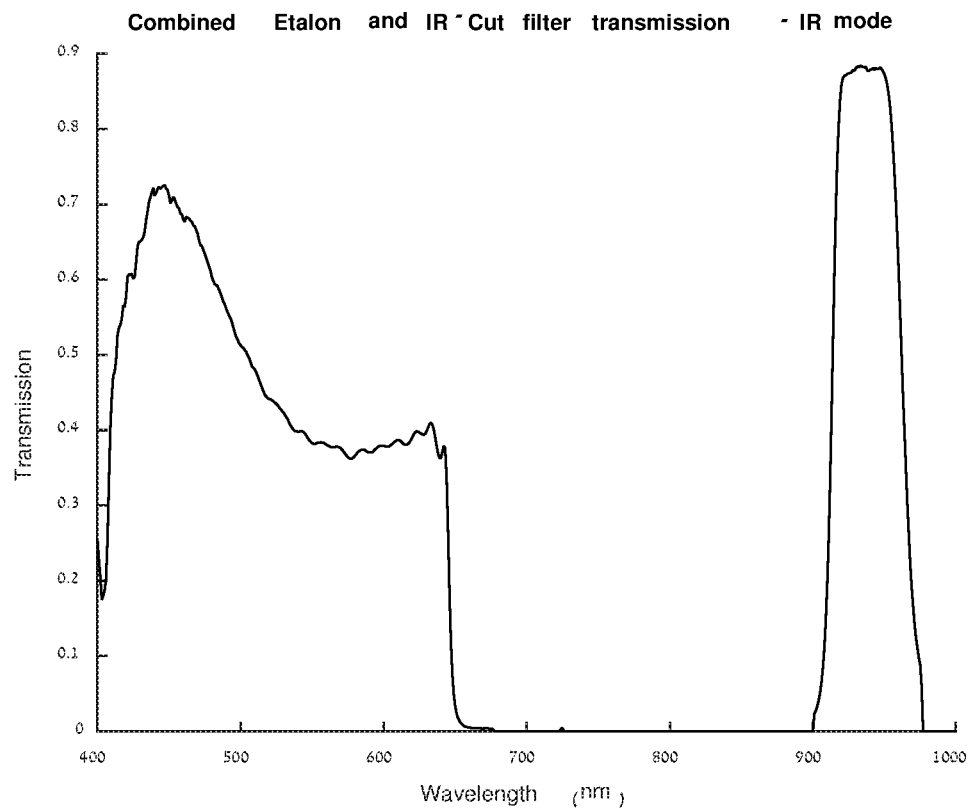
FIG. 9B shows a combined transmission curve of the etalon and IRCF in the IR imaging mode, according to the embodiment of FIG. 8B.

FIG. 9A shows the combined transmission curve of the etalon in the VIS state of FIG. 8A and of an IRCF with a notch at 940 nm in the VIS imaging mode. FIG. 9B shows the combined transmission curve of the etalon in the IR state of FIG. 8B and of the same IRCF in the IR imaging mode. In both imaging modes, the IRCF improves the performance. One main contribution of the IRCF is that the amplitude of all wavelengths-outside of the visible range (except of those within the IR-notch band) are reduced to zero (instead of to 20-30% of a maximal amplitude). That is, the combined etalon-IRCF effect on the transmission is to form two distinct spectral ranges or bands, one in the VIS and the other in the NIR, the two spectral bands separated by a "gap", i.e. a region with a negligible (for VIS mode) or small (for IR mode) VIS/IR energy ratio. Energy may be calculated by integration of a transmission curve over a desired wavelength range.

In one example, an imaging system disclosed herein can obtain a VIS/IR energy ratio of at least 25:1 (4% of energy being IR energy) in the VIS mode and a VIS/IR energy ratio of at least 3:2 (40% of energy being IR energy) in the IR mode. Without the IRCF, a large amount of unwanted energy would reach the image sensor and damage both VIS and IR images. With a regular IRCF (one without a "notch"), it would be impossible to capture the IR band.

Figure 10A:
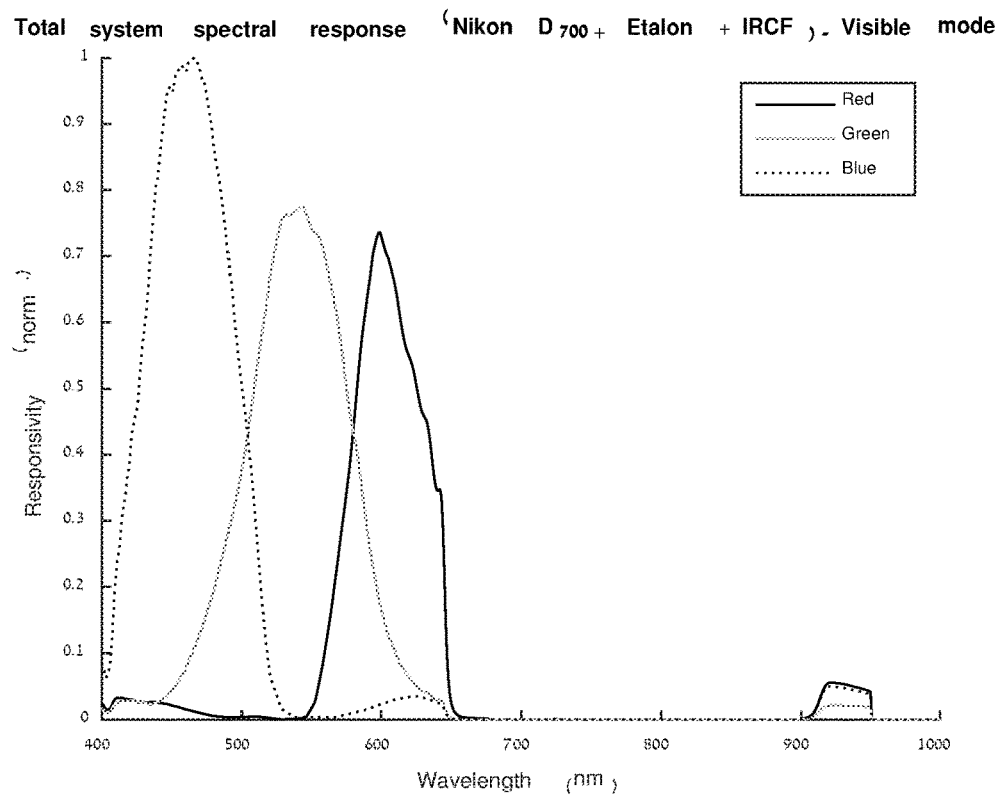
FIG. 10A shows a total system spectral response (TSSR) obtained in the visible imaging mode, according to the embodiment of FIG. 8A.
Figure 10B:
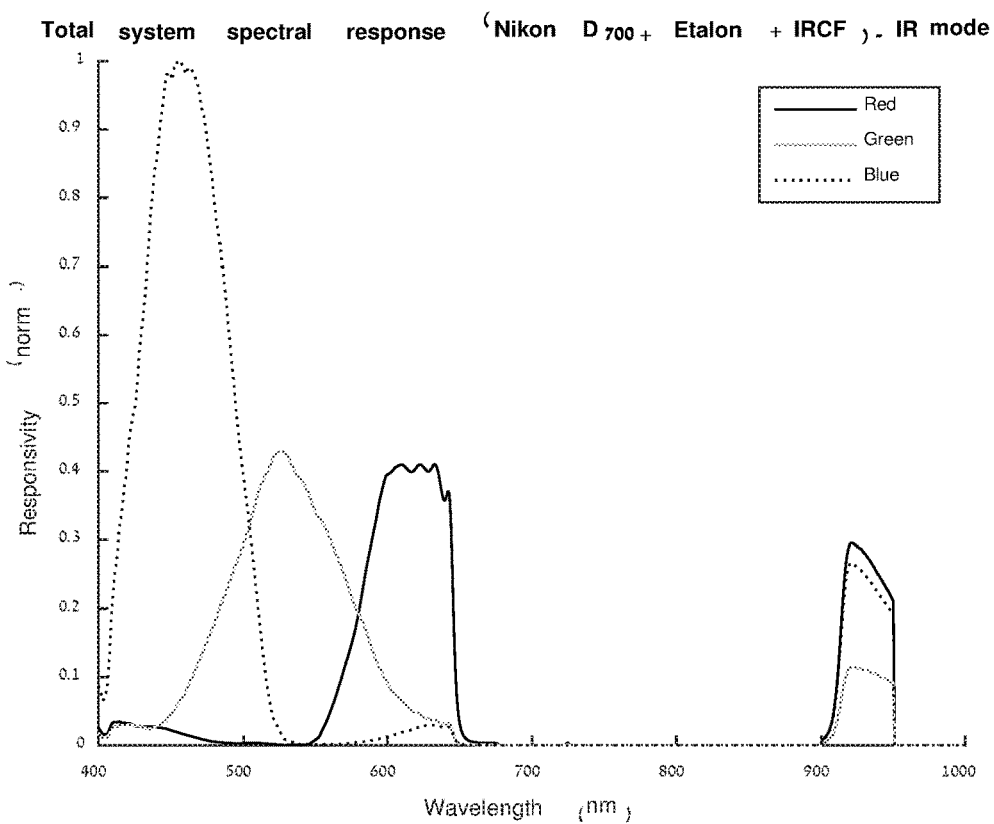
FIG. 10B shows a TSSR obtained in the IR imaging mode, according to the embodiment of FIG. 8B.

FIG. 10A shows the total system spectral response (TSSR) in the VIS imaging mode. FIG. 10B shows the TSSR in the IR imaging mode. One of ordinary skill in the art would recognize that TSSR represents image data that can be processed into an image.

The figures express clearly one of the major advantages of a camera disclosed herein: in VIS mode, FIG. 10A, RGB image data is acquired without almost any IR interference or noise. In IR mode, a significant IR component of spectrum provides IR image data while the VIS (RGB) parts of the spectrum (except for the blue) are significantly reduced. Note that images obtained from the respective image data share a single optical axis, which is advantageous for registration. The sharing of the optical axis may be utilized to improve NIR signal extraction. Alternatively, the information from blue pixels may be ignored and NIR information may be extracted from green and red pixels only.

Etalon Example 2

In a second exemplary embodiment, each etalon mirror includes a 4-layer coating as follows: layer 1 (next to the glass)—174 nm of MgF$_2$, layer 2—97 nm of TiO$_2$, layer 3—140 nm of MgF$_2$, and layer 4—29 nm of TiO$_2$. This provides a VIS imaging mode at a gap of 20 nm between the mirrors and an IR imaging mode at a gap of 150 nm between the mirrors.

Figure 11A:
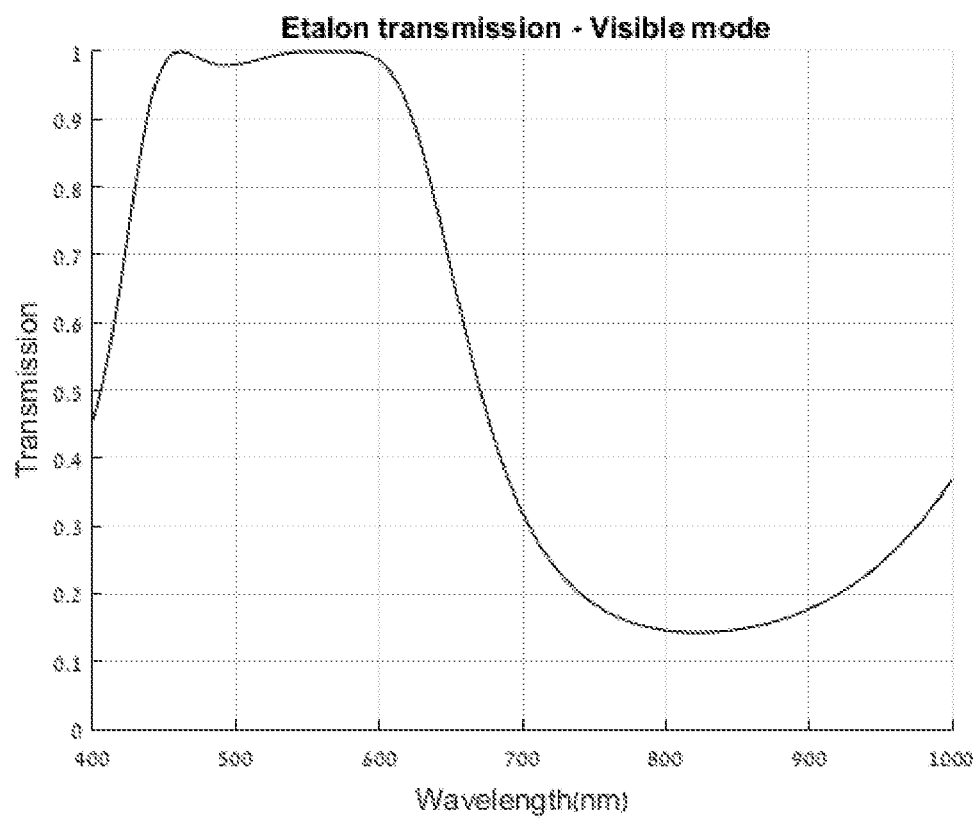
FIG. 11A shows the transmission curve of the etalon in the visible imaging mode, according to another embodiment.
Figure 11B:
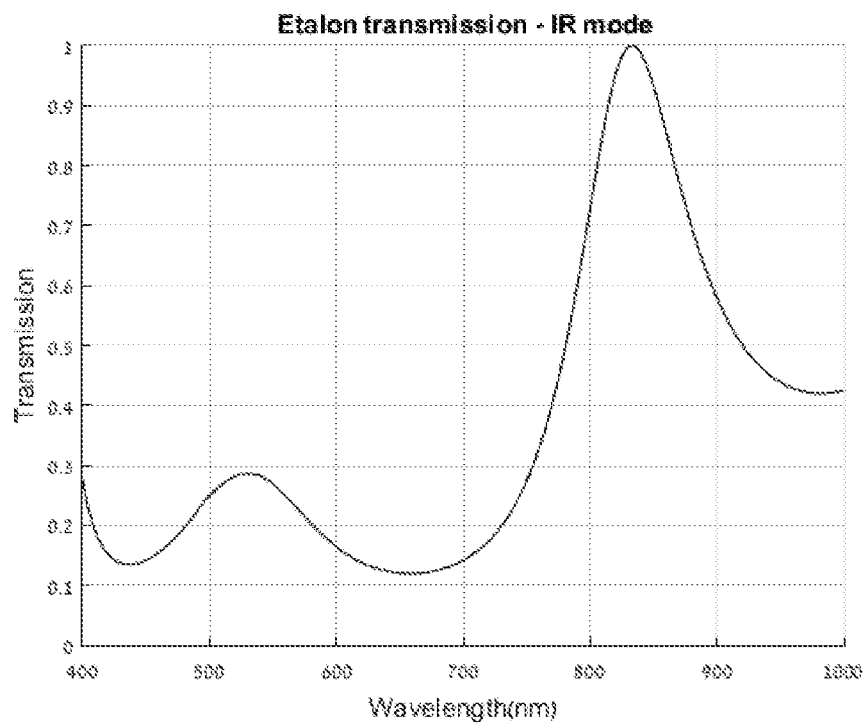
FIG. 11B shows the transmission curve of the etalon in the IR imaging mode, according to another embodiment.
Figure 12A:
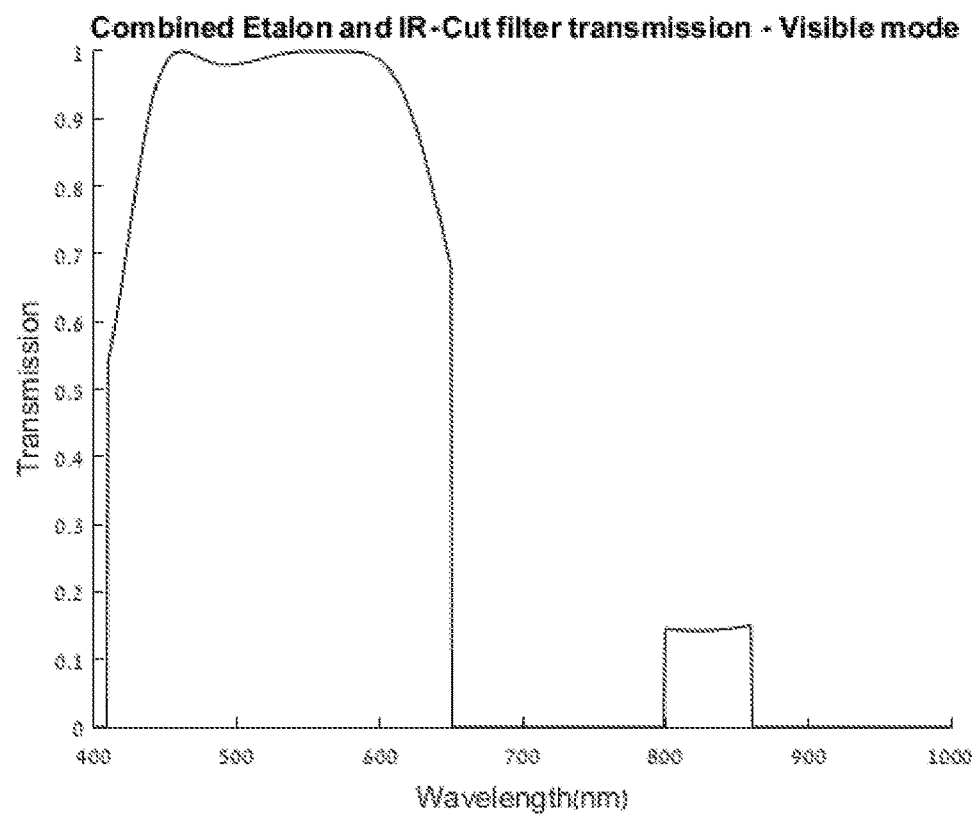
FIG. 12A shows a combined transmission curve of the etalon and IRCF in the visible imaging mode related to the embodiment of FIG. 11A.
Figure 13A:
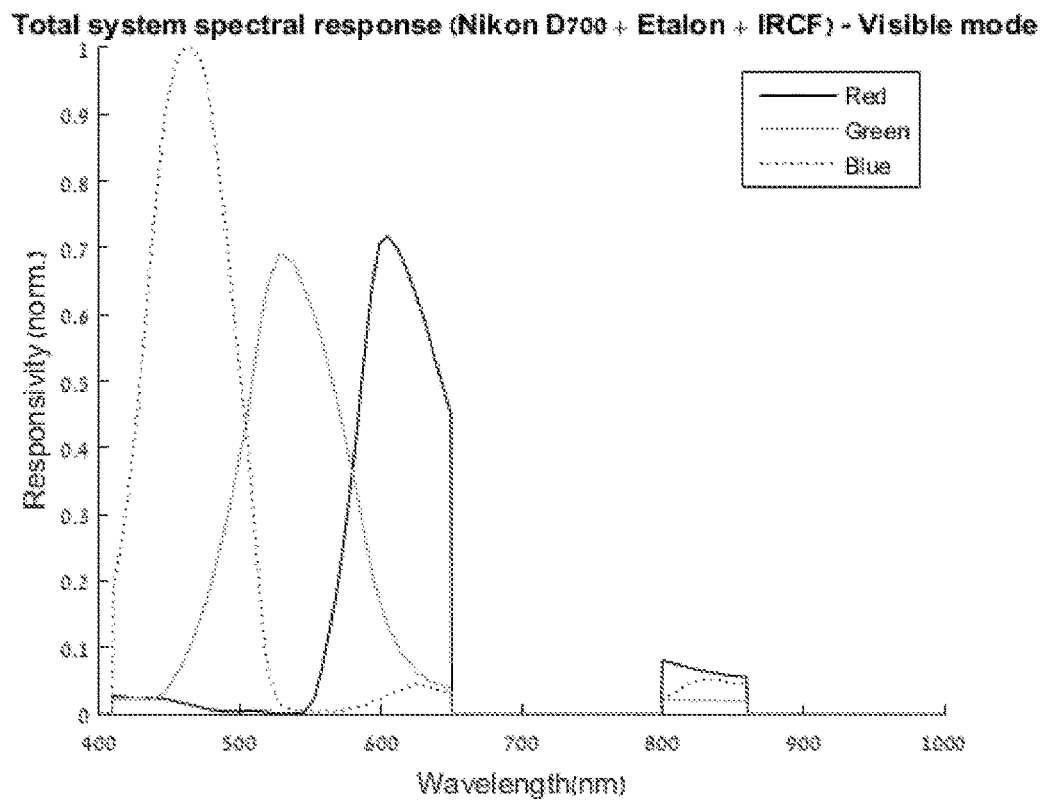
FIG. 13A shows a TSSR obtained in the visible imaging mode related to the embodiment of FIG. 11A.
Figure 13B:
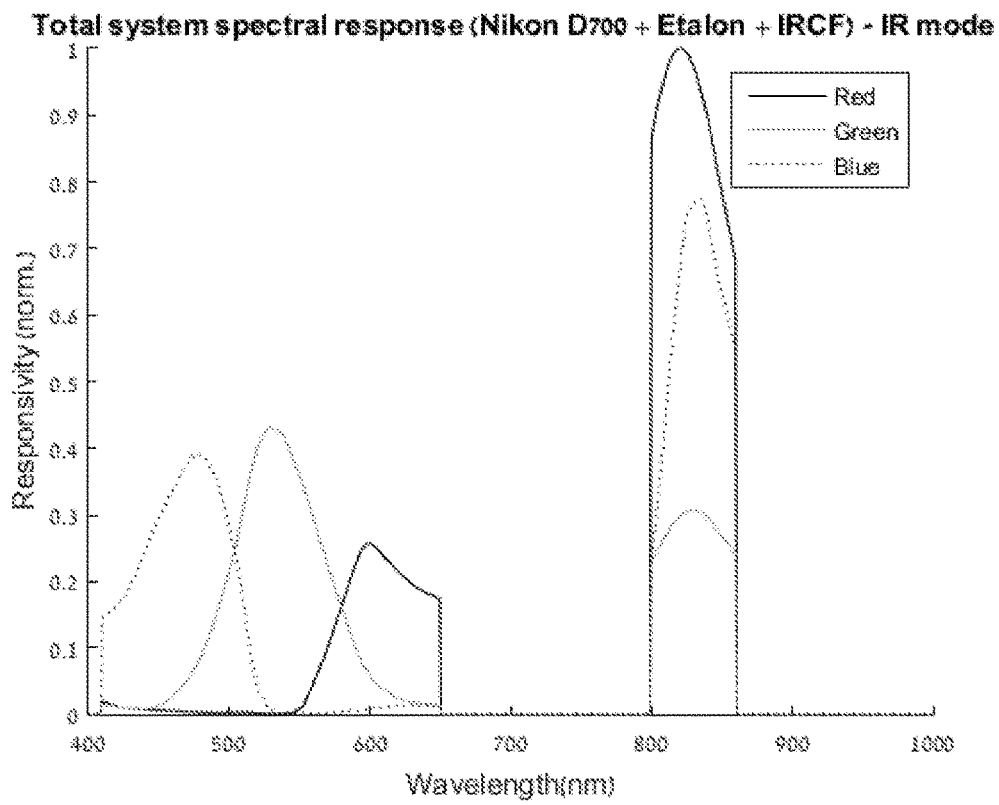
FIG. 13B shows a TSSR obtained in the IR imaging mode related to the embodiment of FIG. 11B.

Similar to the first example, FIG. 11A shows the transmission curve of the etalon in the visible imaging mode, while FIG. 11B shows the transmission curve of the etalon in the IR imaging mode. FIG. 12A shows the combined transmission curve of the etalon and of an IRCF with the notch at 830 nm in the VIS imaging mode, while FIG. 11B shows the combined transmission curve of the etalon and of an IRCF with a notch at 830 nm in the IR imaging mode. FIG. 13A shows the TSSR in the VIS imaging mode, while FIG. 13B shows a TSSR in the IR imaging mode. The effect of the combination of etalon and IRCF on the transmission, which results in two distinct spectral regions separated by a gap with no (in the VIS mode) or small (in the IR mode) VIS/IR ratio are seen clearly.

Methods of Use

Figure 12B:
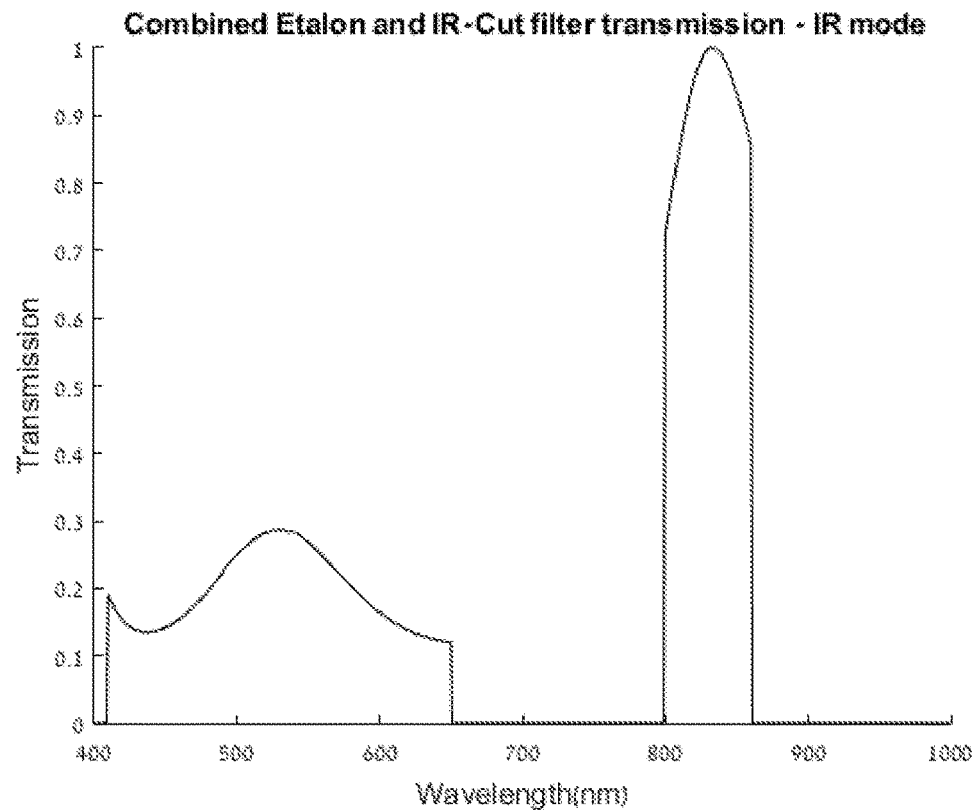
FIG. 12B shows a combined transmission curve of the etalon and IRCF in the IR imaging mode related to the embodiment of FIG. 11B.

In a first example, a system disclosed herein may be used to obtain an IR image of a scene from TSSRs (or "blended images") with the tunable spectral filter (etalon) in the IR imaging mode (see e.g. FIG. 12B or 13B). In a method of use, the controller is configured and operable to position the etalon in at least two operation states, and the method may comprise taking two or more consecutive frames in the IR imaging mode. A first frame is exposed without an IR projector (which projects the IR pattern used for depth reconstruction), or with an IR projector turned off. A second frame is exposed with the IR projector turned on. Taking several such frames can increase the total dynamic range by, for example, combining several frames with different exposures with known high dynamic range (HDR) methods into one frame with larger dynamic range. The second frame captures the same energy as in the first frame with the addition of the projected IR energy reflected from the scene. It may be necessary to adjust the camera parameters, such as exposure time and gain, to support the scene dynamic range when the projector is on. Since the images may not be aligned due to camera movements between and during the exposures, global registration methods may be utilized to align the frames. Such methods are well known and common for similar problems (such as HDR algorithms). Movements of objects within the scene during and between the exposures also may need to be fixed. Local registrations algorithms, also known and common, may be utilized for this purpose. Having the first and second frames aligned, it is now possible to subtract the first image from the second image, pixel by pixel, to obtain image data that corresponds only to the IR projected energy.

For example, assume the combined visible and IR energies of the scene at one pixel located at x, y on the sensor is '$S_{x,y}$', and the IR projected energy at the same pixel '$R_{x,y}$'. Denote by 'F1' the first frame and by 'F2' the second frame. Then, $F1_{x,y}=S1_{x,y}$ and $F2_{x,y}=S2_{x,y}+R_{x,y}$. Registration will then adjust the corresponding pixel location to x',y' and the resulting projected IR data for this pixel is:

$$IR_{x,y}=F2_{x,y}-F1_{x',y'}=S2_{x,y}+R_{x,y}-S1_{x',y'}=R_{x,y}.$$

In a second example, a system disclosed herein may be used to obtain an IR image of a scene from TSSRs uses a VIS image to clean the IR image from the visible-light data. In a method of use, the controller is configured and operable to position the etalon in at least two operation states and the method may comprise taking a VIS image with the IR projector turned off and with the etalon in VIS state, see e.g.

FIG. 12A or 13A. Subsequently, an IR image is taken with IR projector turned on and with the etalon switched to IR state or mode. The second (IR) image will capture some visible energy similar to the energy in the first image (but not the same due to difference in the spectral transmittance of the two modes of the filter in the visible range) with the addition of the projected IR energy reflected from the scene. Adjustment of camera parameters, global registration and local registration may need to be performed as in the first example above. The first image may then be subtracted from the second image, pixel by pixel, to obtain an image that corresponds only to the IR projected energy, as in the first example above.

In a third example, a system disclosed herein may be used to obtain two different IR images with a multi-window IR filter and a monochromatic image sensor. In a method of use, the controller is configured and operable to position the etalon in at least two operation states, a first state for a first IR band image acquisition in a first IR imaging mode and one for a second IR band image acquisition in a second IR imaging mode. Optionally, the imaging system may also include a structured light (SL) projector (not shown), for example an IR SL projector made by OSELA INC. 1869, 32nd Avenue, Lachine, QC, Canada. The imaging system may further optionally include a light source (such as a LED) for iris recognition applications.

Figure 14A:
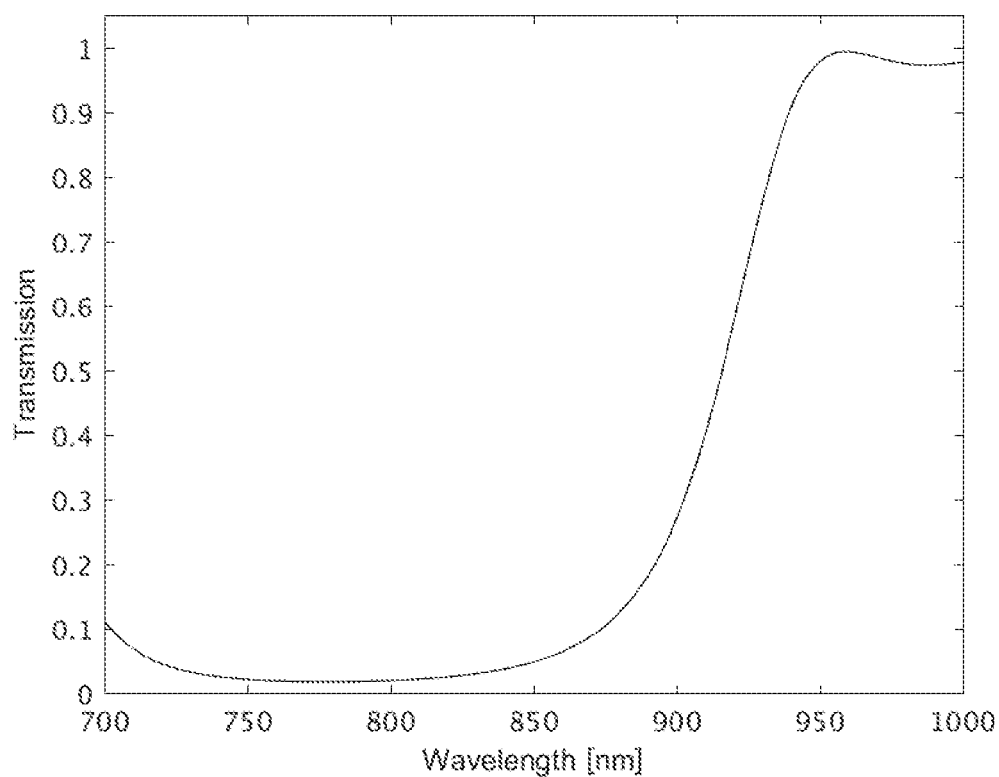
FIG. 14A shows the transmission curve of the etalon in a first IR imaging mode, according to an embodiment.
Figure 14B:
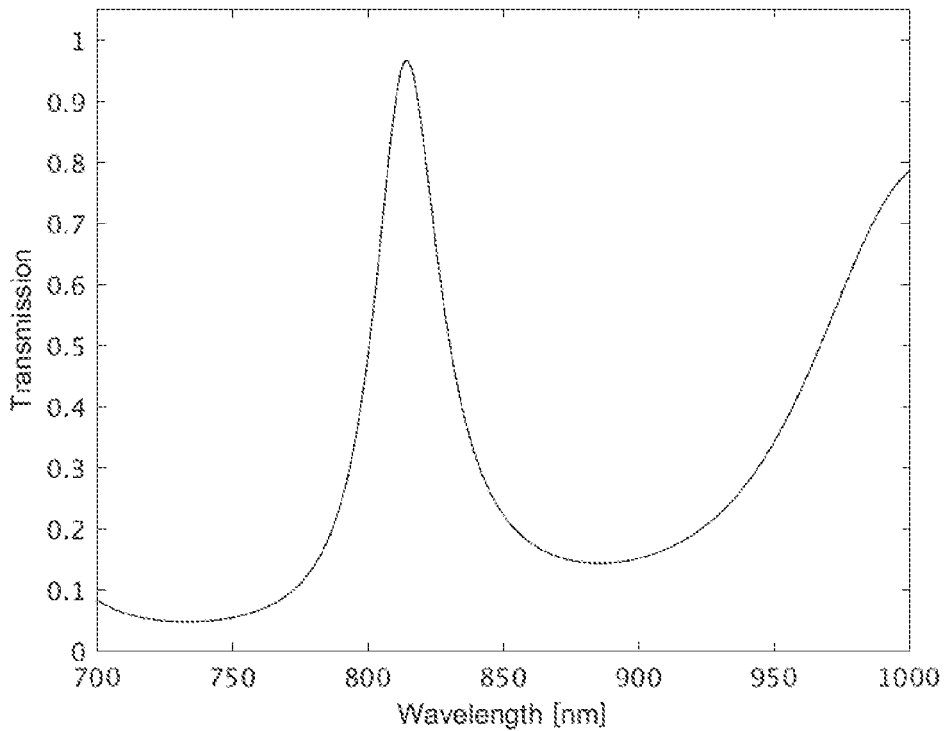
FIG. 14B shows the transmission curve of the etalon in a second IR imaging mode, according to an embodiment.
Figure 15A:
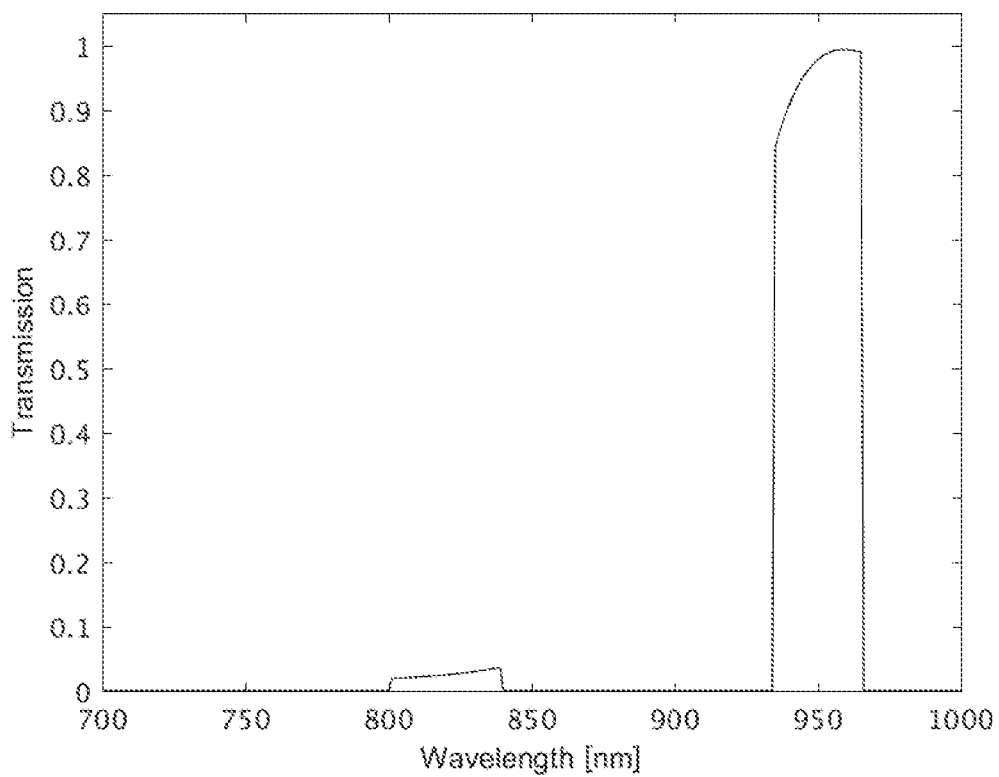
FIG. 15A shows a combined transmission curve of the etalon and dual-band-pass filter in the first IR imaging mode according to the embodiment of FIG. 14A.
Figure 15B:
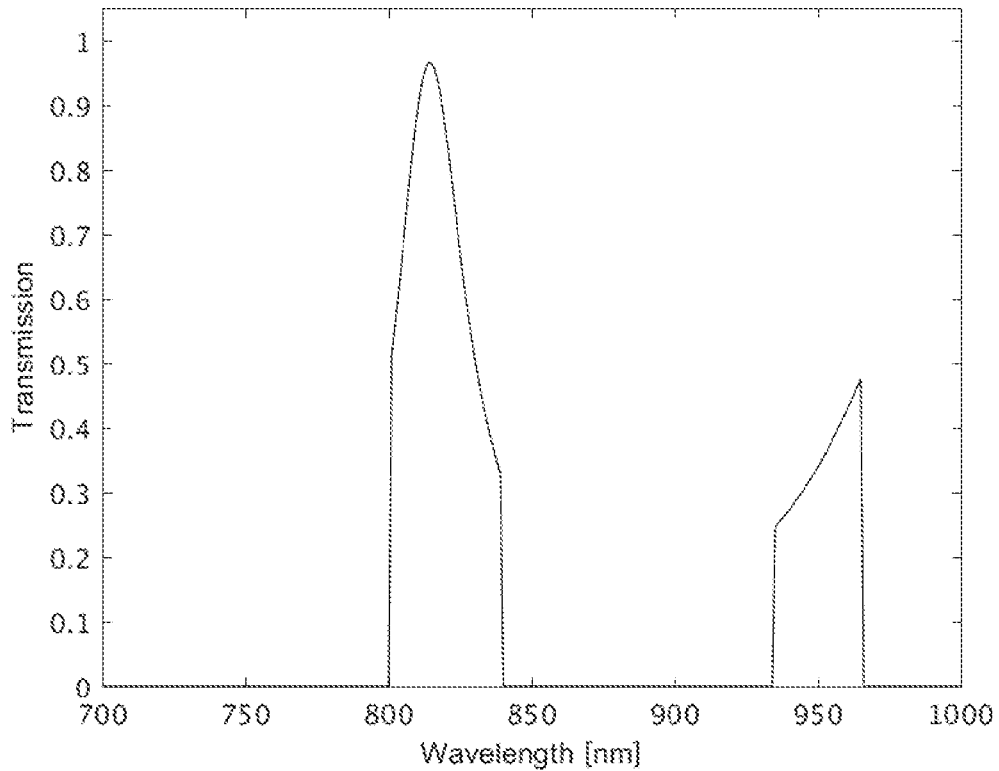
FIG. 15B shows a combined transmission curve of the etalon and dual-band-pass filter in the second IR imaging mode according to the embodiment of FIG. 14B.
Figure 16A:
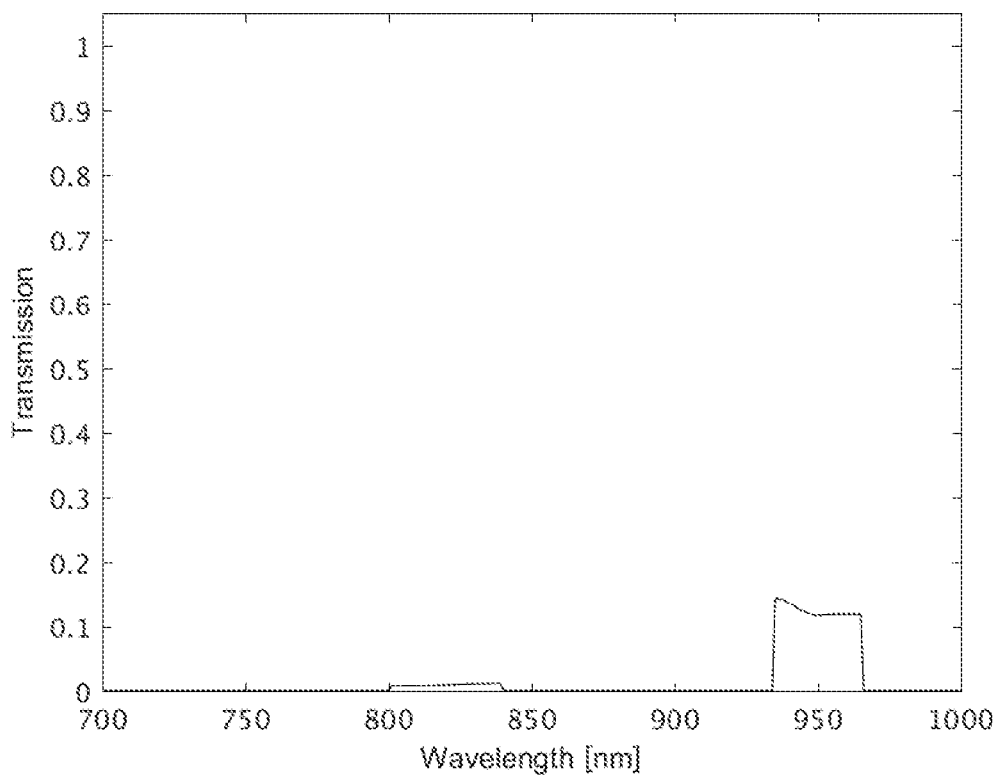
FIG. 16A shows a TSSR obtained in the first IR imaging mode according to the embodiment of FIG. 14A.
Figure 16B:
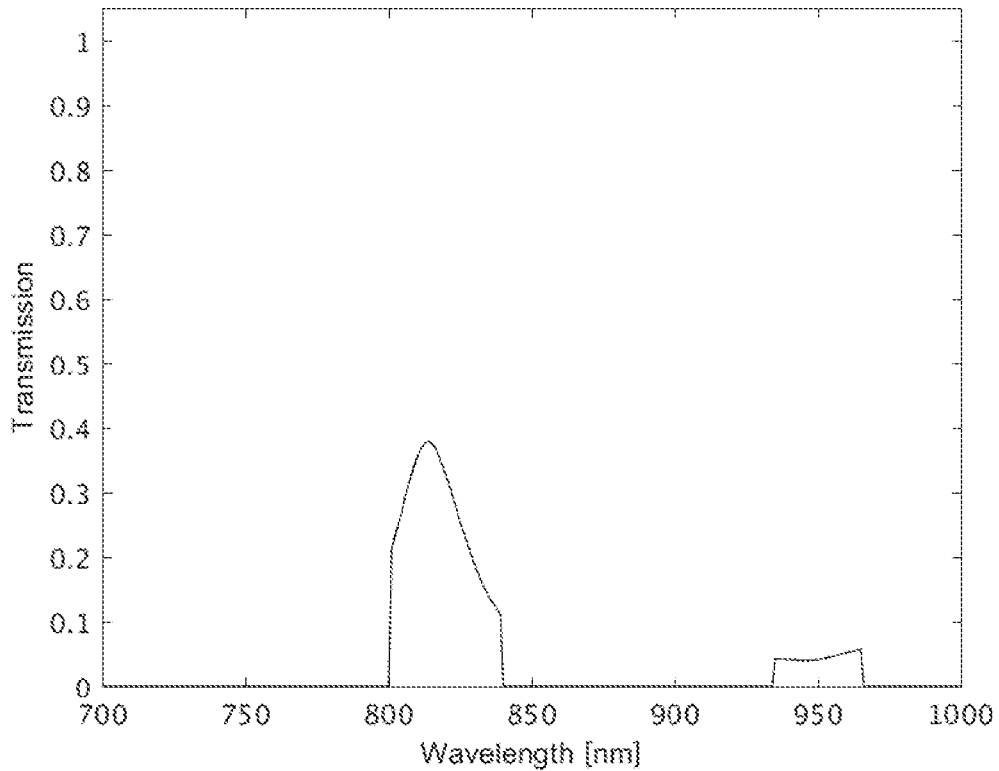
FIG. 16B shows a TSSR obtained in the second IR imaging mode according to the embodiment of FIG. 14B.

The operation of the system in the two IR imaging modes is similar to its operation in the VIS and IR modes described above. FIG. 14A shows the transmission curve of the etalon in the first IR imaging mode. FIG. 14B shows the transmission curve of the etalon in the second IR imaging mode. FIG. 15A shows a combined transmission curve of the etalon and dual-bandpass filter in the first IR imaging mode. FIG. 15B shows a combined transmission curve of the etalon and dual-bandpass filter in the second IR imaging mode. FIG. 16A shows a TSSR in the first IR imaging mode related to the embodiments of FIG. 14A and FIG. 15A. FIG. 16B shows a TSSR in the second IR imaging mode related to the embodiments of FIG. 14B and FIG. 15B.

In a fourth example, a system disclosed herein may be used to for Structured Light (SL) applications in the infrared. When the IR projected light is patterned, as is the case in SL systems, it is possible to extract the depth information from the IR image data. Such depth reconstruction utilizes either a single exposure or multi exposures, in which the pattern of the IR light may vary per each frame captured. The depth reconstruction may be done for example, by using known methods of feature extraction and border recognition to identify the projected pattern in the image and to extract it.

In a fifth example, during exposure it is sometimes favorable to configure the etalon in a mode that reduces or minimizes the transmitted intensity through the fixed filter transmission windows. Such a mode is referred to herein as 'shutter mode'. The shutter mode is not a unique mode, meaning there can be multiple transmission modes for which filter transmission is reduced. Such a mode can be beneficial when used with long exposure durations compared with short projection durations of an illuminator or projector such as LED, VCSEL, etc.

In this example, the controller is configured and operable to position the etalon in at least two operation states, a first state for IR band image acquisition with an IR projector turned on, and a second state of "shutter mode" with an IR projector turned off. Notably, for the second state the etalon can be positioned to allow passage of any wavelength range that is blocked (or at least substantially reduced) by the non-tunable filter or that is outside the sensitivity wavelength range of the sensor. These two states could be switched while the image processor is operable for image acquisition from a rolling shutter type image sensor—thus effectively reducing the exposure time of the image sensor to incoming light.

According to one example, the controller can be configured and operable to control the switching between the two states such that activation of the first state is performed for a predefined time period within a time window during which overlapping exposure of all pixels (or at least a majority thereof) occurs and the second state is activated before and/or after the predefined time period. The controller can be further configured and operable to activate an IR projector during the predefined time period to thereby reduce IR projection time period. This approach enables to reduce exposure to the IR projector's light (e.g. for reasons of eye safety or energy consumption) while maintaining sufficient signal to noise ratio.

The presently disclosed subject matter further contemplates a non-tunable filter having one bandpass or "window" in its transmission profile incorporated in an image acquisition system configured to operate in "shutter mode". According to this example, the controller can be configured and operable to synchronize the switching between two operation states of the etalon, one state being an image capturing state and the other state being an image blocking state (or "shutter mode").

According to an example, in the image capturing state the etalon is positioned to allow passage of a wavelength range overlapping with wavelength range of the single transmission window of the non-tunable filter. The controller can be configured and operable to control the switching between the two states such that activation of the image capturing state is performed for a predefined time period within a time window during which overlapping exposure of all pixels (or at least a majority thereof) occurs. Before and after this time period, the etalon is set to an image blocking state, where the etalon is positioned to allow passage of any wavelength range that is blocked (or at least substantially reduced) by the non-tunable filter. Assuming for example that the transmission window is in the IR range, the controller can be further configured and operable to activate an IR projector during the time period to thereby reduce the time period of IR projection as explained above.

Figure 17A:
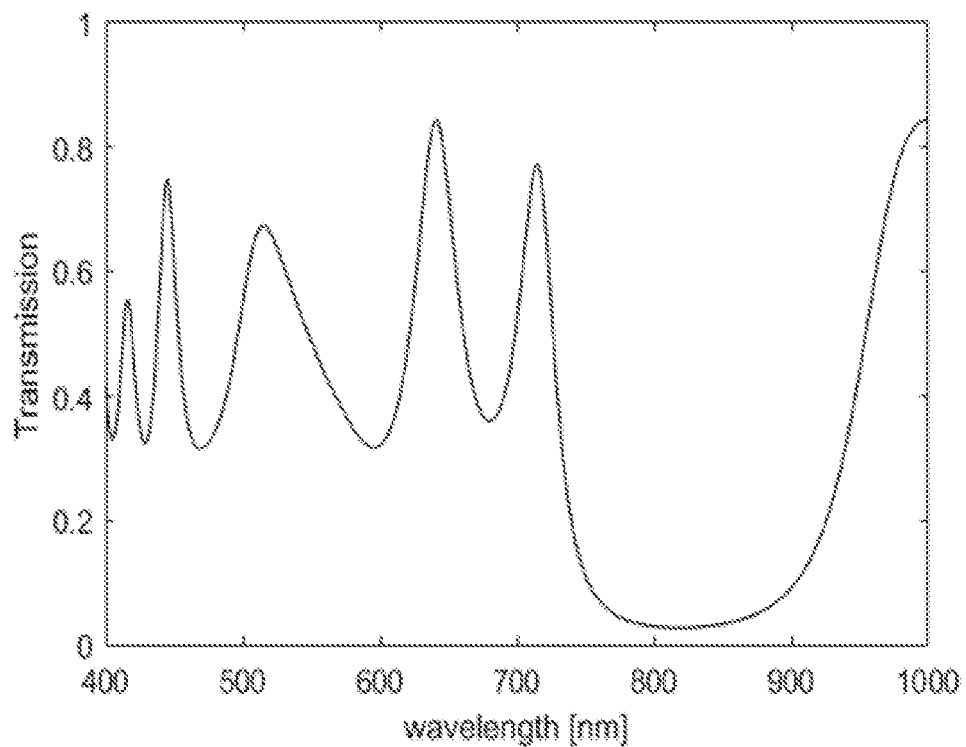
FIG. 17A shows the transmission curve of the etalon in a first example of shutter mode.
Figure 17B:
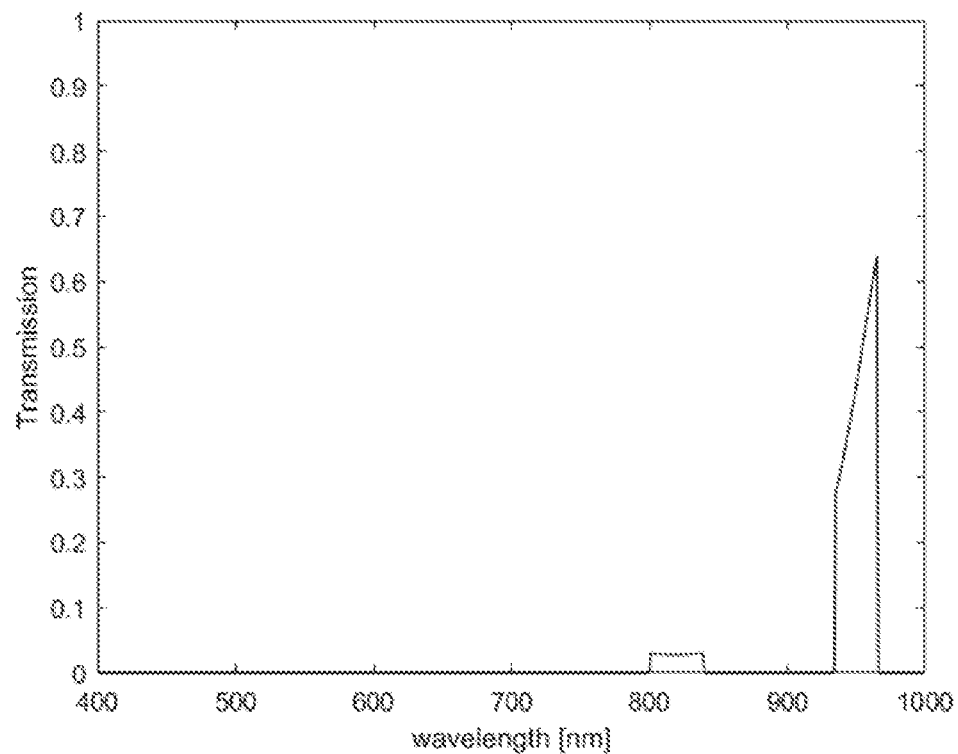
FIG. 17B shows a combined transmission curve of the etalon and dual-band-pass filter in the first example of shutter mode.
Figure 17C:
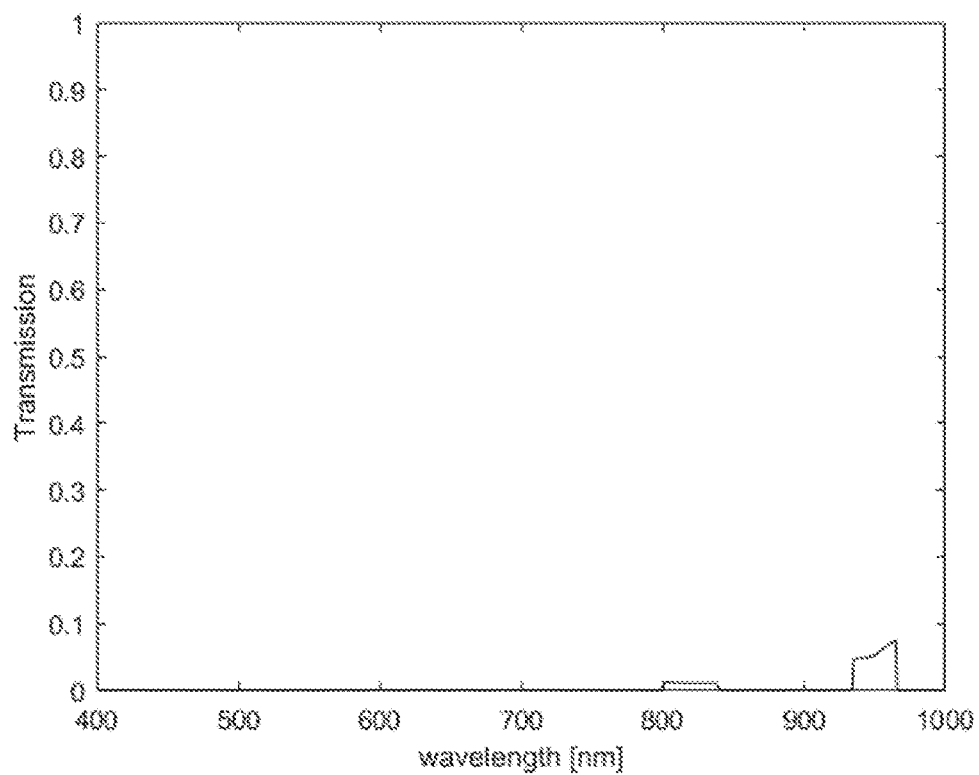
FIG. 17C shows a TSSR obtained in the first example of shutter mode.

A first example of shutter mode operation with the dual-band pass filter used in the third example above (of which the TSSR in IR is shown in FIGS. 16A and 16B) is shown in FIGS. 17A-17C. FIG. 17A shows the transmission curve of the etalon in a shutter mode, FIG. 17B shows a combined transmission curve of the etalon and dual-band-pass filter in the shutter mode, and FIG. 17C shows a TSSR in the shutter mode.

Figure 18A:
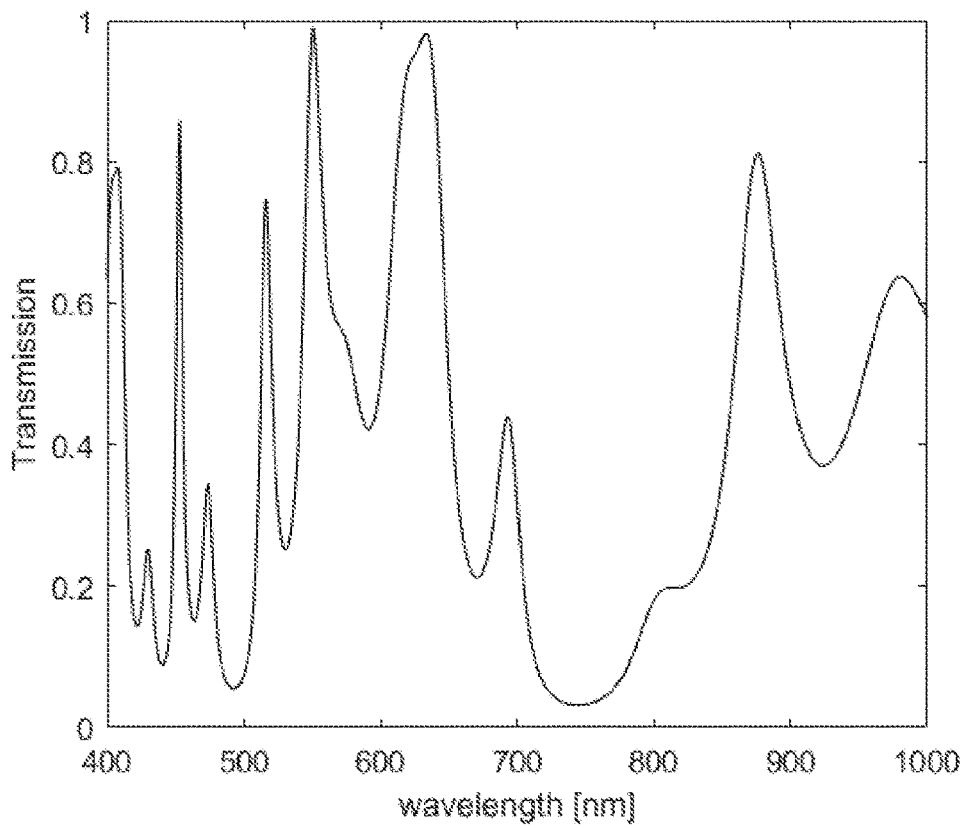
FIG. 18A shows the transmission curve of the etalon in a second example of shutter mode.
Figure 18B:
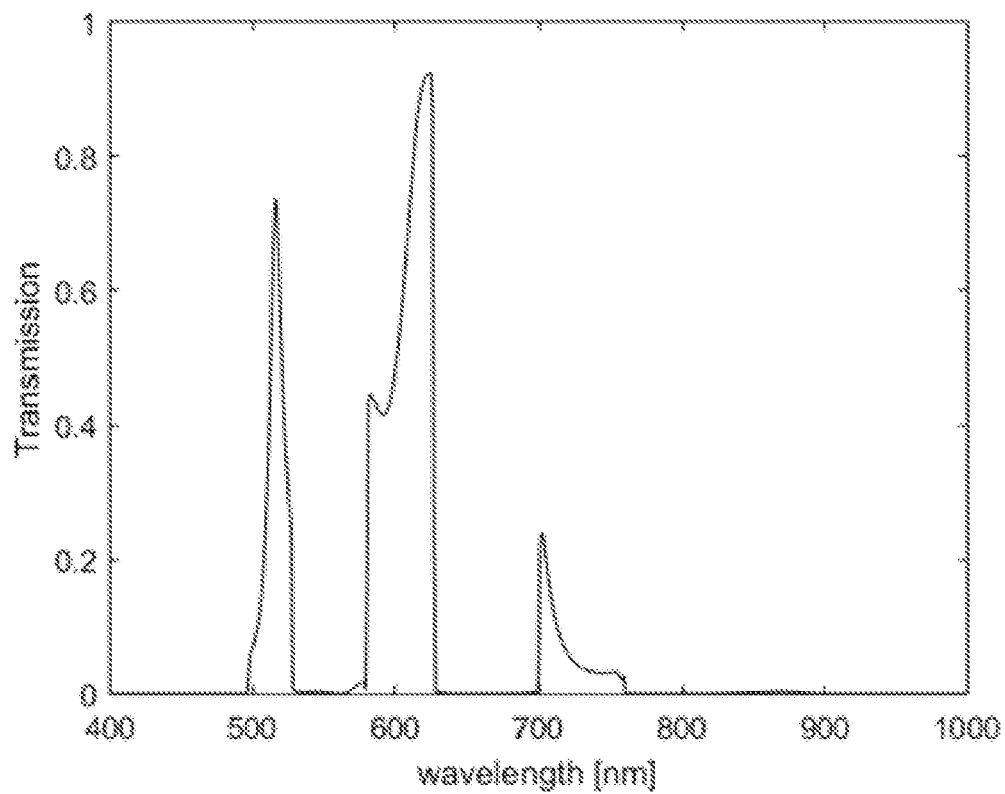
FIG. 18B shows a combined transmission curve of the etalon and of a triple-band-pass filter in the second example of shutter mode.
Figure 18C:
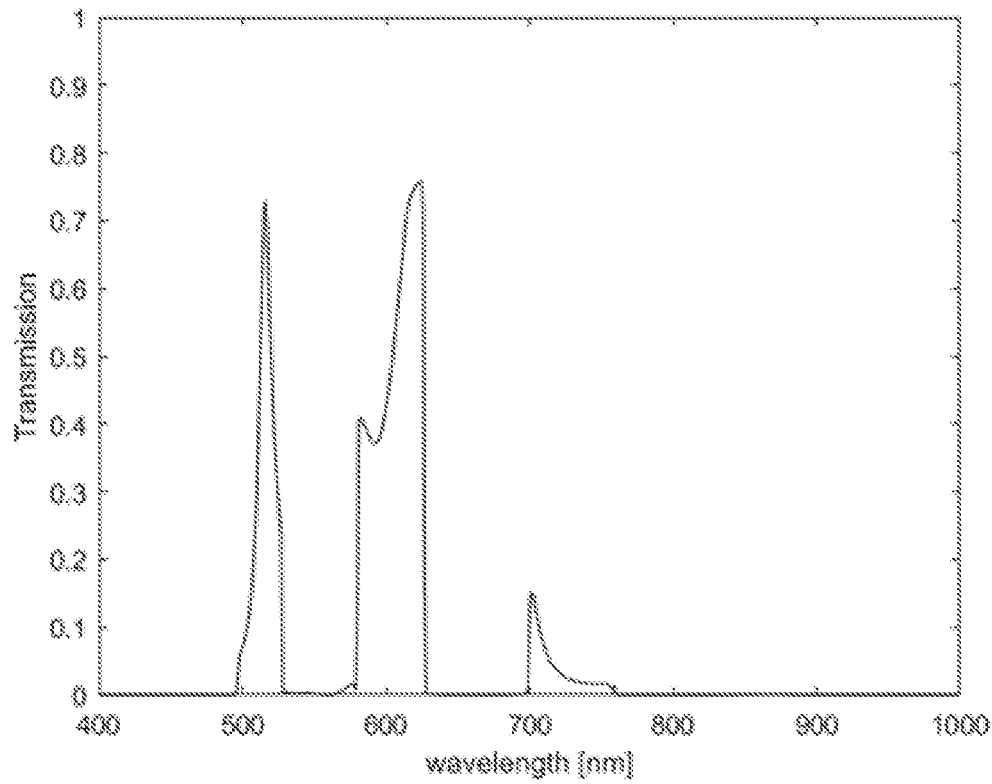
FIG. 18C shows a TSSR obtained in the second example of shutter mode.

A second example of shutter mode operation with a triple-band pass filter is shown in FIGS. 18A-18C. FIG. 18A shows the transmission curve of the etalon in a shutter mode, FIG. 18B shows a combined transmission curve of the etalon and of a triple-band-pass filter in the shutter mode, FIG. 18C shows a TSSR in the shutter mode.

One advantage of a system disclosed herein that combines a compact digital camera with a multi-bandpass (multi-window) filter and a tunable filter is that it allows acquisition of image data in at least two separate bands without loss of spatial resolution. Another advantage is that it can potentially replace the two or more image sensors in imaging systems based on a beam splitter, or in imaging systems comprising two or more camera modules, each dedicated to imaging in a separate and different wavelength.

All patents and patent applications mentioned in this application are hereby incorporated by reference in their entirety for all purposes set forth herein. It is emphasized that citation or identification of any reference in this application shall not be construed as an admission that such a reference is available or admitted as prior art.

While this disclosure has been described in terms of certain embodiments and generally associated methods, alterations and permutations of the embodiments and methods will be apparent to those skilled in the art. The disclosure is to be understood as not limited by the specific embodiments described herein, but only by the scope of the appended claims.

What is claimed is:

1. A system, comprising:
   a) an image sensor, a tunable spectral filter and a non-tunable multi-bandpass filter, the tunable spectral filter and the multi-bandpass filter arranged in a common optical path between an object and the image sensor; and
   b) a controller configured and operable to position the tunable spectral filter in a plurality of operation states correlated with a plurality of imaging modes, wherein at least one of the plurality of imaging modes provides respective image data of the object;
   wherein the tunable spectral filter is a micro-electro-mechanical system (MEMS) etalon device; and
   wherein the non-tunable multi-bandpass filter comprises at least a first transmission window and a second transmission window, wherein each transmission window allows passage of light in a certain wavelength range, wherein the controller is configured to operate the tunable filter to be positioned in a first operation state to allow passage of light in a first wavelength range, which at least partly overlaps with the wavelength range of the first transmission window of the non-tunable multi-bandpass filter, and wherein in a second operation state the tunable filter is positioned to allow passage of light in a second wavelength range different than the first wavelength range, the second wavelength range of the tunable filter at least partly overlaps with the wavelength range of the second transmission window of the non-tunable multi-bandpass filter.

2. The system of claim 1, wherein the image sensor is a color image sensor.

3. The system of claim 2, wherein the at least one transmission window is a visible transmission window and/or an infrared transmission window.

4. The system of claim 1, wherein the image sensor is a monochromatic image sensor.

5. The system of claim 1, wherein the plurality of imaging modes includes a visible imaging mode and an infrared imaging mode.

6. The system of claim 1, wherein the plurality of imaging modes includes two infrared imaging modes.

7. The system of claim 1, wherein the plurality of imaging modes includes an infrared imaging mode and a shutter mode.

8. The system of claim 1, wherein the plurality of operation states includes three states correlated with three imaging modes.

9. The system of claim 1, wherein the MEMS etalon device comprises a front mirror and a back mirror, the front and back mirrors separated in an initial un-actuated etalon state by a gap having a pre-stressed un-actuated gap size, the MEMS etalon device configured to assume at least one actuated state in which the gap has an actuated gap size gap greater than the pre-stressed un-actuated gap size.

10. The system of claim 9, wherein the pre-stressed un-actuated gap size is determined by a back stopper structure in physical contact with the front mirror, the back stopper structure formed on a first surface of the back mirror that faces the front mirror.

11. A method of operating an imaging system comprising a tunable spectral filter and a non-tunable multi-bandpass filter, the tunable spectral filter and the multi-bandpass filter arranged in a common optical path between an object and an image sensor, wherein the non-tunable multi-bandpass filter comprises at least a first transmission window and a second transmission window, each transmission window allows passage of light in a certain wavelength range, the method comprising:
   a) tuning the tunable spectral filter to a first operation state that correlates with a first imaging mode to allow passage of light in a first wavelength range which at least partly overlaps with a wavelength range of the first transmission window of the non-tunable multi-bandpass filter such that passage of light outside the first wavelength range is reduced by the non-tunable multi-bandpass filter; and
   b) tuning the tunable spectral filter to a second operation state that is correlated with a second imaging mode to allow passage of light in a second wavelength range different than the first wavelength range, wherein the second wavelength range of the tunable filter at least partly overlaps with a wavelength range of the second transmission window of the non-tunable multi-bandpass filter;
   wherein the tunable spectral filter is a micro-electro-mechanical system (MEMS) etalon device.

12. The method of claim 11, wherein the wavelength range of the first transmission window of the non-tunable multi-bandpass filter is narrower than the first wavelength range of the tunable filter such that wavelength range of light passing towards the image sensor is narrower than the first wavelength range, and/or wherein the wavelength range of the second transmission window of the non-tunable multi-bandpass filter is narrower than the second wavelength range of the tunable filter such that wavelength range of light passing towards the image sensor is narrower than the second wavelength range.

13. The method of claim 12, wherein the first operation state correlates with a VIS imaging mode and the second operation state correlates to a IR imaging mode, the method further comprising, while the tunable spectral filter is in the first operation state, capturing at least one VIS image and while the tunable spectral filter is in the second operation state, activating an IR projector and capturing at least one IR image, and subtracting image data from the at least one VIS image from the image data of the at least one IR image to thereby enhance IR image data.

14. The method of claim 12, wherein the first operation state correlates with a first IR imaging mode and the second operation state correlates with a shutter mode, the method further comprising correlating the tuning of the tunable spectral filter to the first operation state, with a time window during which overlapping exposure of all pixels or a majority of pixels in the sensor occurs, activating an IR projector during the time window and correlating the tuning of the tunable spectral filter to the second operation state, outside the time window.

15. The method of claim 12, wherein the first operation state correlates with a first VIS imaging mode and wherein the second operation state correlates with a shutter mode, the method further comprising correlating the tuning of the tunable spectral filter to the first operation state, with a time window during which overlapping exposure of all pixels or a majority of pixels in the sensor occurs, activating a VIS projector during the time window and correlating the tuning of the tunable spectral filter to the second operation state, outside the time window.

16. A system, comprising:
 a) an image sensor, a tunable spectral filter and a non-tunable multi-bandpass filter, the tunable spectral filter and the multi-bandpass filter arranged in a common optical path between an object and the image sensor; and
 b) a controller configured and operable to position the tunable spectral filter in a plurality of operation states correlated with a plurality of imaging modes, wherein at least one of the plurality of imaging modes provides respective image data of the object;
 wherein the tunable spectral filter is a micro-electro-mechanical system (MEMS) etalon device; and
 wherein the non-tunable multi-bandpass filter comprises at least a first transmission window and a second transmission window, wherein each transmission window allows passage of light in a certain wavelength range, wherein the controller is configured to operate the tunable filter to be positioned in a first operation state to allow passage of light in a first wavelength range, which at least partly overlaps with the wavelength range of the first transmission window of the non-tunable multi-bandpass filter, and wherein in a second operation state the tunable filter is positioned to allow passage of light in a second wavelength range different than the first wavelength range, the second wavelength range of the tunable filter at least partly overlaps with the wavelength range of the second transmission window of the non-tunable multi-bandpass filter;
 wherein the first and second wavelength ranges do not overlap such that in the first operation state the transmission of light of the second wavelength range is reduced or blocked and in the second operation state the transmission of light of the first wavelength range is reduced or blocked.

* * * * *